(12) United States Patent
Park et al.

(10) Patent No.: US 7,584,389 B2
(45) Date of Patent: Sep. 1, 2009

(54) TURBO DECODING APPARATUS AND METHOD

(75) Inventors: Sung-Jin Park, Seoul (KR); Min-Goo Kim, Suwon (KR); Soon-Jae Choi, Yongin-shi (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 1257 days.

(21) Appl. No.: 10/634,746

(22) Filed: Aug. 6, 2003

(65) Prior Publication Data
US 2004/0044945 A1 Mar. 4, 2004

(30) Foreign Application Priority Data
Aug. 6, 2002 (KR) .................. 10-2002-0046410

(51) Int. Cl.
*G06F 11/00* (2006.01)
(52) U.S. Cl. .................. 714/704; 714/789; 714/794
(58) Field of Classification Search .................. 714/704, 714/706, 794, 755, 780, 752, 746, 782
See application file for complete search history.

(56) References Cited

U.S. PATENT DOCUMENTS

| | | | | |
|---|---|---|---|---|
| 6,516,444 | B1* | 2/2003 | Maru | 714/795 |
| 6,718,504 | B1* | 4/2004 | Coombs et al. | 714/755 |
| 6,760,879 | B2* | 7/2004 | Giese et al. | 714/755 |
| 6,763,494 | B2* | 7/2004 | Hewitt | 714/780 |
| 6,813,742 | B2* | 11/2004 | Nguyen | 714/794 |
| 6,968,021 | B1* | 11/2005 | White et al. | 375/340 |

FOREIGN PATENT DOCUMENTS

EP 1122890 8/2002
EP 1261139 11/2002

OTHER PUBLICATIONS

Mohammed M. Mansour et al., "Design Methodology for High-Speed Iterative Decoder Architectures", *Proceedings of IEEE Conference on Acoustics, Speech, and Signal Processing*, vol. 3, pp. III-3085-III-3088 (May 2002).

(Continued)

*Primary Examiner*—Jacques Louis-Jacques
*Assistant Examiner*—Fritz Alphonse
(74) *Attorney, Agent, or Firm*—Roylance, Abrams, Berdo & Goodman, LLP

(57) ABSTRACT

This invention relates to a turbo decoding apparatus and method for a communication system. A high-rate memory buffer operating at the same frequency as a turbo decoder is arranged between a memory buffer of a receiver and the turbo decoder. The decoding apparatus reads data bits stored in the memory buffer of the receiver via the high-rate memory buffer, delays the read data bits for a time required in the turbo decoder, and then applies the delayed data bits to a Soft-In Soft-Out (SISO) decoder of the turbo decoder. The memory buffer of the receiver outputs data bits at an operating frequency or clock of the turbo decoder.

42 Claims, 20 Drawing Sheets

OTHER PUBLICATIONS

Alexander Worm et al., "VLSI Architectures for High-Speed MAP Decoders", *Proceedings of 14th International Conference on VLSI Design*, pp. 446-453 (Jan. 2001).

"Biodirectional Shift Registers", HTTP://WWW.EELAB.USYD.EDU.AU/DIGITAL_TUTORIAL/PART2/REGISTER06.HTML, (Feb. 1999).

Guido Masera et al., "VLSI Architectures for Turbo Codes", *IEEE Inc.*, vol. 7, No. 3, pp. 369-379 (Sep. 1999).

Warren J. Gross et al., "Difference Metric Soft-Output Detection: Architecture and Implementation", pp. 1-8 (Sep. 2001).

N. Sklavos et al., "A New Low Power and High Speed Didirectional Shift Register Architecture", *VLSI Design Laboratory*, (Jul. 2001).

Gross, Warren J., Gaudet, Vincent C., Gulak, P. Glenn, "Difference Metric Soft-Output Detection: Architecture and Implementation" pp. 1-8, figure 7, Sep. 2001.

Sklavos, N., Kitsos, P., Zervas, N., & Koufopavlou, O.; "A New Low Power and high Speed Bidirectional Shift Register Architecture", figures 1 and 2, Jul. 2001.

Masera, G., et al., "VLSI Architectures for Turbo Codes", IEEE Transactions on Very Large Scale Integration (VLSI) Systems, IEEE Inc., New York, vol. 7, No. 3, pp. 369-379, Sep. 1999.

"Bidirectional Shift Registers", Feb. 1999.

\* cited by examiner

FRAME MODE

WINDOW MODE

TURBO DECODING APPARATUS AND METHOD

PRIORITY

This application claims priority under 35 U.S.C. § 119 to an application entitled "Turbo Decoding Apparatus" filed in the Korean Intellectual Property Office on Aug. 6, 2002 and assigned Serial No. 2002-46410, the contents of which are incorporated herein by reference.

BACKGROUND OF THE INVENTION

1. Field of the Invention

The present invention relates generally to a decoding apparatus and method in a communication system, and in particular, to an apparatus and method for performing turbo decoding.

2. Description of the Related Art

In digital communication systems, forward error correction (FEC) codes are generally used to effectively correct an error which may occur on a channel during data transmission. This increases the reliability of data transmission. Forward error correction codes include a turbo code. Since the turbo code, compared with a convolutional code, has superior error correction capability during high-speed data transmission, it has been adopted in both a synchronous Code Division Multiple Access 2000 (CDMA2000) system and an asynchronous Universal Mobile Telecommunications System (UMTS) both of which are attracting public attention as a third generation mobile communication system.

FIG. 1 is a block diagram illustrating an example of a receiver in a third generation mobile communication system. FIG. 1 shows a structure of a receiver in, for example, a Evolution Data and Voice (1×EV-DV) system which enables high-speed packet data communication.

In FIG. 1, a received signal is subjected to Radio Frequency (RF), Intermediate Frequency (IF) and baseband processing by a reception signal processor 10. A signal processed by the reception signal processor 10 is separated according to channels. A receiver 30 processes a forward fundamental channel (F-FCH) signal, a forward supplemental channel (F-SCH) signal, and a forward dedicated control channel (F-DCCH) signal. A receiver 40 processes a forward packet data channel (F-PDCH) signal. A receiver 50 processes a forward packet data control channel (F-PDCCH). The receiver 40 includes blocks 42, 44, 46 and 48. The block 42 has a function of minimizing a loss which may occur on a channel, and includes a finger and a combiner (both of which are not shown). The block 44 has a function of converting a signal so as to enable channel decoding, and includes a demodulation buffer, a Walsh decover, a symbol demapper and a descrambler (all of which are not shown). The block 48 has a function of performing decoding and providing the decoding result to an L1 layer 70 for its reference, and includes a turbo decoder and an output buffer (both of which are not shown). The block 46 has a function of delivering a demodulation symbol to the block 48, for decoding, and includes a combiner, a deshuffler, a deinterleaver, and a memory buffer (all of which are not shown).

A searcher 20 is an element for searching a received signal, and a (HARQ) Hybrid Automatic Repeat Request (HARQ) controller 60 is an element for requesting retransmission of a reception-failed symbol.

FIG. 2 is a block diagram illustrating an example of a conventional turbo decoder apparatus, and in particular, illustrates an example of a detailed structure of the turbo decoder block 48 shown in FIG. 1. In the drawing, the turbo decoder is constructed with, for example, a Soft-In Soft-Out (SISO) scheme. The turbo decoder can also be implemented using a (MAP) Maximum A Posteriori (MAP) scheme or a Register Exchange Soft Output Viterbi Algorithm (RESOVA) scheme instead of the SISO scheme. The SISO scheme is a scheme for calculating probability with reliability for a symbol, and the RESOVA scheme is a scheme for calculating probability for a codeword by considering a path over which a symbol passes as a long codeword.

Referring to FIG. 2, symbols (data bits) stored in a memory buffer 46-1 of the block 46 illustrated in FIG. 1 are provided to an input terminal of the block 48. In the memory buffer 46-1, a systematic code, which is a systematic code of interleaved bits, and a parity code #1 and a parity code #2, which are non-systematic codes of the interleaved bits, are separately stored. Bits of the systematic code and bits of the parity codes are simultaneously provided from the memory buffer 46-1 to the block 48. For example, in a 1×EV-DV system, the memory buffer 46-1 is a Quasi-Complementary Turbo Code (QCTC) memory buffer for storing symbols received from a transmitter after being encoded with a QCTC code. Since one code output from the memory buffer 46-1 is comprised of M bits and three codes of systematic code and parity codes Parity#1 and Parity#2 are all output from the memory buffer 46-1, a 3×M-bit bus is formed between the memory buffer 46-1 and the block 48, and codes output from the memory buffer 46-1 are provided to a multiplexer (MUX) 48-1 of the block 48.

The turbo decoder block 48 includes the multiplexer 48-1, a SISO decoder (or a decoder for the SISO scheme) 48-2, an interleaver 48-3, a deinterleaver 48-4, an output buffer 48-5, and a Cyclic Redundancy Code (CRC) checker 48-6. The multiplexer 48-1 multiplexes bits from the memory buffer 46-1, an output of the interleaver 48-3 and an output of the deinterleaver 48-4. The SISO decoder 48-2 SISO-decodes an output of the multiplexer 48-1, using the construction illustrated in FIG. 3. The interleaver 48-3 interleaves an output of the SISO decoder 48-2, and the deinterleaver 48-4 deinterleaves an output of the SISO decoder 48-2. The output buffer 48-5 stores the deinterleaving result of the deinterleaver 48-4 so that the L1 layer processor 70 can refer to the deinterleaving result. The CRC checker 48-6 performs CRC check on the deinterleaving result by the deinterleaver 48-4, and provides the CRC check result to the L1 layer processor 70.

FIG. 3 is a block diagram illustrating an example of a conventional SISO decoder. The drawing shows an example in which a SISO decoder is released with a sliding window mode scheme, and it is assumed herein that the number of windows is 2. The SISO decoder is identical to the MAP decoder (or a decoder for the MAP scheme) in basic structure and different from the MAP decoder in only output value.

Referring to FIG. 3, the SISO decoder calculates several metrics in its decoding process. That is, during a decoding operation of the SISO decoder, a delta metric, an alpha ($\alpha$) metric, a beta ($\beta$) metric, and log likelihood ratio (LLR) values are calculated. A demultiplexer (DEMUX) 205 accesses data bits stored in the memory buffer 46-1 at a predetermined rate, i.e., a rate three times higher than a clock (or operating frequency) of the turbo decoder, and provides a first output (1), a second output (2) and a third output (3). A delta metric calculation section 210 includes three calculators 211 to 213, which calculate delta metrics for the first to third outputs (1) to (3), respectively. An alpha metric calculator 220 receives the delta metric calculated by the delta metric calculator 211 and calculates an alpha metric corresponding thereto. A beta metric calculation section 230 is comprised of two calculators 231 and 232, and a multiplexer 233. That is, the beta metric calculation section 230 includes the calculator 231 for calculating a first beta (β1) metric, the calculator 232 for calculating a second beta (β2) metric, and the multiplexer 233 for multiplexing the calculation results by the calculators 231 and 232. An LLR calculation section 240 is comprised of three calculators 241 to 243, and receives the alpha metric calculated by the alpha metric calculator 220 and the multiplexing result by the multiplexer 233 and calculates LLR values corresponding thereto. A subtraction section 250 is comprised of three subtracters 251 to 253, which subtract the first output (1) of the demultiplexer 205 from the LLR values calculated by the LLR calculators 241 to 243, and provide the subtraction result to the interleaver 48-3 and the deinterleaver 48-4 illustrated in FIG. 2, for interleaving/deinterleaving.

As described above, the conventional SISO decoder is comprised of the delta metric calculation section, the alpha metric calculation section and the beta metric calculation section, for metric calculation, and the LLR calculation section for decoding the metrics based on probability. Here, the beta metric calculation section is comprised of two calculators according to the number of the windows.

The delta metric, also known as "state metric," represents transition probability from one state to another state of an encoder. The α metric, also known as "forward state metric," represents the sum of a metric of a probability value to be transitioned from a previous state to the next state and a metric of a probability value to become a previous state. The α metric refers to accumulation probability over a period of a signal calculated from a first received signal, and is sequentially calculated. The β metric, also known as "backward state metric," represents accumulation probability from a current state to a previous state. If the α metric and the β metric are both calculated, then a value of LLR is calculated. LLR represents probability for a symbol, and expresses a ratio of probability of "1" to probability of "0" in a log scale. The LLR calculators 241 to 243 for calculating LLR each calculate probability for a symbol based on transition probability for a forward state and a reverse state. Here, an LLR value with a positive number represents a symbol "1," while an LLR value with a negative number represents a symbol "0." In order to decode a signal received in this way, the SISO decoder calculates both an α metric value and a β metric value. Here, since the β metric value must be calculated in opposite order of a received signal stored in the memory buffer 46-1, an LLR value cannot be cannot be calculated until calculation of the β metric is completely ended.

FIGS. 4A and 4B are block diagrams illustrating examples of metric calculation order by the conventional SISO decoder of FIG. 3. Specifically, FIG. 4A shows a process of calculating an α metric, while FIG. 4B shows a process of calculating a β metric. Referring to FIGS. 4A and 4B, it is noted that the process of calculating an α metric is different from the process of calculating a β metric. An α metric $\alpha_k$ is calculated from a $(k-1)^{th}$ α metric, which is a previous value, while a β metric $\beta_k$ is calculated from a $(k+1)^{th}$ β metric, which is a next value. In order to calculate a β metric in this way, a received signal must be referred to in the opposite order in which it was received, causing an initial delay by the entire length of the received signal.

FIGS. 5A and 5B are block diagrams illustrating an example of the calculation order in a frame mode and a window mode by the conventional SISO decoder of FIG. 3. Specifically, FIG. 5A shows the order of calculating metrics in a frame mode by the SISO decoder 48-2, while FIG. 5B shows the order of calculating metrics in a window mode shown in FIG. 3 by the SISO decoder 48-2.

Referring to FIG. 5A, since an α metric and an LLR value λ are calculated after a β metric is completely calculated, an initial delay occurs in a frame period. A SISO decoder with such a frame mode scheme calculates an LLR value λ by calculating an α metric after calculating a β metric. Therefore, a delay time occurs during calculation of a β metric. In order to reduce such an initial delay, a sliding window mode scheme has been proposed.

Referring to FIG. 5B, a SISO decoder 48-2 in a window mode divides a received signal in a predetermined length in order to calculate a β metric. If a β metric is calculated with a received signal divided in a predetermined length, initially calculated values have incorrect probability, but more correct values are calculated as time goes by. Actually, when LLR is calculated, a value calculated from a period where a correct value is calculated can be used. Here, for the convenience of calculation, lengths of an incorrect period and a reliable period are set to the same length. While one window calculates correct values, another window calculates incorrect values thus to alternate the correct values and the incorrect values. An example of calculating a β metric using two windows is the beta metric calculation section 230 shown in FIG. 3. Therefore, a SISO decoder 48-2 in a window mode calculates three values of a α metric, a β1 metric and a β2 metric. A delta metric must be calculated before the three metrics are calculated.

Referring to FIG. 3, the delta metric calculators 211 to 213 receive data bits of a received signal stored in different addresses of the memory buffer 46-1, and calculate corresponding delta metrics. That is, the delta metric calculators 211 to 213, as illustrated in FIG. 7, read signals in different positions from the memory buffer 46-1 for a 1-clock time of an operating frequency for the turbo decoder.

FIG. 6 is a block diagram illustrating an example of a processing flow of a data bit input and a metric output by the SISO decoder shown in FIG. 3. Referring to FIG. 6, it is noted that data bits of a received signal stored in different addresses of the memory buffer 46-1 are applied to the delta metric calculators 211 to 213 of the SISO decoder 48-2. A horizontal line indicates a time axis, and it can be noted that different data bits are provided to the delta metric calculators 211 to 213 with the passage of time. For such an operation, the memory buffer 46-1 must be accessed three times faster than an operating frequency of the turbo decoder. That is, a clock three times faster than a turbo decoder clock must be used as a clock of the memory buffer 46-1.

FIG. 7 is a timing diagram illustrating an example of timing for a memory buffer access operation by the SISO decoder shown in FIG. 3. Referring to FIG. 7, the SISO decoder reads data bits data1, data2 and data3 stored in different addresses addr1, addr2 and addr3 of the memory buffer 46-1, and calculates a delta metric for an α metric, a delta metric for a β1 metric and a delta metric for a β2 metric. For that purpose, a read operation of the memory buffer 46-1 is performed at a rate three times faster than a turbo decoder clock.

A memory buffer access operation and a data processing operation illustrated in FIGS. 6 and 7 are performed on the assumption that a window size (or length) W is W=4 which is much shorter than an actually applied length. When actually applied to a high-speed (or high-rate) turbo decoder, the window size will be set to 24 to 48 (W=24~28), and it can be set to a larger value according to circumstances. Although the window size W is changed, a structure of the buffer is not changed and the entire shape of a data flow diagram is also not changed, but increased in a ratio of a length.

Referring to FIG. 6, an alphabet written in each box of a delta block input represents data bits stored in different addresses of the memory buffer 46-1, and means a value applied to the delta metric calculator 210. When a β metric is first calculated as compared with an α metric, two β metric calculators 231 and 232 alternately operate (see FIG. 6 with reference to the T1 period and T2 period). An α metric is simultaneously calculated from a time when a reliable β1 metric is calculated (see T2 period). When a β metric is calculated, incorrect probability values are output for the beginning W period, but a metric value with reliable probability is output for the following W period. In an α output, a β1 output and a β2 output, an alphabet in each box means order of a metric. Since outputs of the delta metric calculators 212 and 213 for β1 and β2 alternate with each other, β metrics calculated by the beta metric calculators 231 and 232 are continuous. In FIG. 6, a circle shown by a dotted line indicates that data bits necessary at that time are received signals in different positions, or different addresses d, n and f of the memory buffer 46-1.

Meanwhile, if it is assumed that the SISO decoder shown in FIG. 3 is used for a 1×EV-DV system that requires a high data rate, a turbo decoder operating at a frequency of about 30 to 60 MHz is required. Therefore, an operating frequency of the memory buffer 46-1 must be determined within a 90 to 180 MHz range, which amounts to three times the operating frequency of a turbo decoder. Such an operating frequency of the turbo decoder is not appropriate for a mobile communication terminal that requires low power consumption.

As described above, the 1×EV-DV system, a typical $3^{rd}$ generation mobile communication system, enables high-speed packet data communication. In such a communication system, a high-speed turbo decoder is required for high performance. For high-speed decoding, data bits (or symbols) stored in the memory buffer connected to a previous stage of the turbo decoder must be applied to the turbo decoder in an appropriate method. Compared with the SISO decoder with a frame mode scheme, the SISO decoder with a sliding window mode scheme can reduce an initial delay. Therefore, it is preferable to use the SISO decoder with a sliding window mode scheme as a turbo decoder. The SISO decoder with a sliding window mode scheme performs a decoding operation after reading data bits corresponding to the number of windows from the memory buffer. For example, if the number of windows is 2, the SISO decoder calculates metrics for decoding after reading data bits three times from the memory buffer. Such an operation raises no problem when the turbo decoder operates at a low rate, but it may raise a problem when the turbo decoder operates at a high rate. This is because when the memory buffer must operate three times faster than the turbo decoder and an operating frequency of the turbo decoder is low, using a memory buffer having a rate three times higher than the operating frequency is reasonable to a mobile communication terminal, but when an operating frequency of the turbo decoder is high, using a memory buffer having a rate three times higher than the operating frequency will be considerably unreasonable to the mobile communication terminal. For example, a turbo decoder for a CDMA2000 or UMTS system aimed at providing a high-speed data service must operate at a high rate in order to reach its full capability. In addition, if even an operating frequency of the memory buffer is increased, power consumed in the mobile communication terminal will be dramatically increased. The drastic increase in power consumption is not appropriate for the mobile communication terminal that requires low power design.

SUMMARY OF THE INVENTION

It is, therefore, an object of the present invention to provide a turbo decoding apparatus and method for use in a communication system that services high-speed packet data, such as a 1×EV-DV system.

It is another object of the present invention to provide an apparatus and method for matching the operating frequency of a turbo decoder to the operating frequency of a memory buffer that applies data bits to the turbo decoder in a mobile communication terminal operating at a high rate.

It is further another object of the present invention to provide an apparatus and method that enables a mobile communication terminal to consume less power by removing the requirement to increase an operating frequency of a memory buffer that stores received data bits for decoding in a mobile communication terminal operating at a high rate.

To achieve the above and other objects, the invention arranges a high-rate memory buffer operating at the same frequency as a turbo decoder, between a memory buffer of a receiver and the turbo decoder, and provides a decoding apparatus for reading data bits stored in the memory buffer of the receiver via the high-rate memory buffer, delaying the read data bits for a time required in the turbo decoder, and then applying the delayed data bits to a Soft-In Soft-Out (SISO) decoder of the turbo decoder. The memory buffer of the receiver outputs data bits at an operating frequency (or clock) of the turbo decoder. The invention removes a requirement to increase an operating frequency of the memory buffer of the receiver even when a rate of data that must be processed in the turbo decoder is increased. Thus, the invention enables a circuit for a mobile communication environment to consume less power.

In accordance with a first embodiment of the present invention, a turbo decoding apparatus in a communication system comprises a memory buffer and a SISO decoder. The memory buffer is comprised of a unidirectional shift register, and one or more bidirectional shift registers. The SISO decoder is comprised of a first metric calculation section to fourth metric calculation section, and a subtraction section.

The unidirectional shift register has an input terminal for data input and an output terminal for data output. The unidirectional shift register forms bit streams of a first length by sequentially receiving and shifting input data bits via the input terminal and then sequentially outputs the formed bit streams of the first length via the output terminal.

The bidirectional shift registers each have a first terminal and a second terminal for data input/output, and the input data bits are divided into groups each comprised of bits of a second length which is ½ of the first length. The bidirectional shift register forms bit streams of the second length by sequentially receiving and shifting bits of odd-numbered groups among the divided groups via the first terminal and then sequentially outputs the formed bit streams via the first terminal; and forms bit streams of the second length by sequentially receiving and shifting bits of even-numbered groups among the divided groups via the second terminal and then sequentially outputs the formed bit streams via the second terminal.

The first metric calculation section receives output bits of the respective shift registers, and calculates corresponding delta metrics. The second metric calculation section receives a delta metric from the first metric calculation section corresponding to the unidirectional shift register, and calculates an alpha metric. The third metric calculation section receives delta metrics from the first metric calculation section corresponding to the bidirectional shift registers, and calculates beta metrics. The fourth metric calculation section receives the alpha metric, also receives a multiplexing result of the beta metrics, and calculates LLR values corresponding to the respective shift registers. The subtraction section subtracts an output of the unidirectional shift register from the respective LLR values, and outputs the subtraction result for interleaving/deinterleaving.

Preferably, the memory buffer further comprises a control logic for determining whether the input data bits are bits of odd-numbered groups or bits of even-numbered groups among the divided groups, and provides the bidirectional shift registers with select signals for applying the input data bits to the first terminal or the second terminal according to the determination result.

Preferably, the memory buffer further comprises a demultiplexer and a multiplexer corresponding to each of the bidirectional shift registers. The demultiplexer has an input terminal for receiving the input data bits and a first output terminal and a second output terminal connected to the first terminal and the second terminal, respectively, applies bits of the odd-numbered groups to the first terminal via the first output terminal in response to a corresponding select signal provided from the control logic, and applies bits of the even-numbered groups to the second terminal via the second output terminal. The multiplexer multiplexes bit streams output via the first terminal and bit streams output via the second terminal in response to a corresponding select signal provided from the control logic, and outputs the multiplexed bit streams to the first metric calculation section.

Preferably, the select signals are control signals for applying the input data bits to the bidirectional shift registers at different times.

Preferably, the bits of the odd-numbered groups are sequentially output via the first terminal and, at the same time, the bits of the even-numbered groups are sequentially received and shifted via the second terminal.

Preferably, the number of the bidirectional shift registers is determined by the number of widows.

Preferably, the first length and the second length are determined by a size of windows and the number of windows.

Preferably, the second length is determined by multiplying the size of windows by the number of windows.

Preferably, the input data bits are received at a clock rate of a turbo decoder.

In accordance with a second embodiment of the present invention, a turbo decoding apparatus in a communication system comprises a memory buffer and a SISO decoder. The memory buffer is comprised of first stage's bidirectional shift registers and a second stage's bidirectional shift register. The SISO decoder is comprised of first to fourth metric calculation sections and a subtraction section.

The first stage's bidirectional shift registers each have a first terminal and a second terminal for data input/output, and input data bits are divided into groups each comprised of bits of a predetermined length. The first stage's bidirectional shift registers forms bit streams of the length by sequentially receiving and shifting bits of odd-numbered groups among the divided groups via the first terminal and then sequentially outputs the formed bit streams via the first terminal; and forms bit streams of the length by sequentially receiving and shifting bits of even-numbered groups among the divided groups via the second terminal and then sequentially outputs the formed bit streams via the second terminal.

The second stage's bidirectional shift register has a third terminal and a fourth terminal for data input/output, and the second stage's bidirectional shift register forms bit streams of the length by sequentially receiving and shifting bits sequentially output via the first terminal, via the third terminal, and then sequentially outputs the formed bit streams via the third terminal; and forms bit streams of the length by sequentially receiving and shifting bits sequentially output via the second terminal, via the fourth terminal, and then sequentially outputs the formed bit streams via the fourth terminal;

The first metric calculation section receives output bits of the respective shift registers, and calculating corresponding delta metrics. The second metric calculation section receives a delta metric from the first metric calculation section corresponding to the unidirectional shift register, and calculates an alpha metric. The third metric calculation section receives delta metrics from the first metric calculation section corresponding to the bidirectional shift registers, and calculates beta metrics. The fourth metric calculation section receives the alpha metric, also receives a multiplexing result of the beta metrics, and calculates LLR values corresponding to the respective shift registers. The subtraction section subtracts an output of the unidirectional shift register from the respective LLR values, and outputs the subtraction result for interleaving/deinterleaving.

Preferably, the memory buffer further comprises a control logic for determining whether the input data bits are bits of odd-numbered groups or bits of even-numbered groups among the divided groups, and providing the first stage's bidirectional shift registers with select signals for applying the input data bits to the first terminal or the second terminal according to the determination result.

Preferably, the memory buffer further comprises a demultiplexer and a multiplexer corresponding to each of the first stage's bidirectional shift registers. The demultiplexer has an input terminal for receiving the input data bits and a first output terminal and a second output terminal connected to the first terminal and the second terminal, respectively, applies bits of the odd-numbered groups to the first terminal via the first output terminal in response to a corresponding select signal provided from the control logic, and applies bits of the even-numbered groups to the second terminal via the second output terminal. The multiplexer multiplexes bits output via the first terminal and bits output via the second terminal in response to a corresponding select signal provided from the control logic, and outputs the multiplexed bits to the first metric calculation section.

Preferably, the memory buffer further comprises a multiplexer corresponding to the second stage's bidirectional shift register, and the multiplexer multiplexes bits output via the third terminal and bits output via the fourth terminal in response to a corresponding select signal provided from the control logic, and outputs the multiplexed bits to the first metric calculation section.

Preferably, the select signals are control signals for applying the input data bits to the bidirectional shift registers at different times.

Preferably, the bits of the odd-numbered groups are sequentially output via the first terminal and, at the same time, the bits of the even-numbered groups are sequentially received and shifted via the second terminal.

Preferably, the number of the first stage's shift registers is determined by the number of windows.

Preferably, the first length and the second length are determined by a size of windows and the number of windows.

Preferably, the second length is determined by multiplying the size of windows by the number of windows.

Preferably, the input data bits are received at a clock rate of a turbo decoder.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Figure 1:
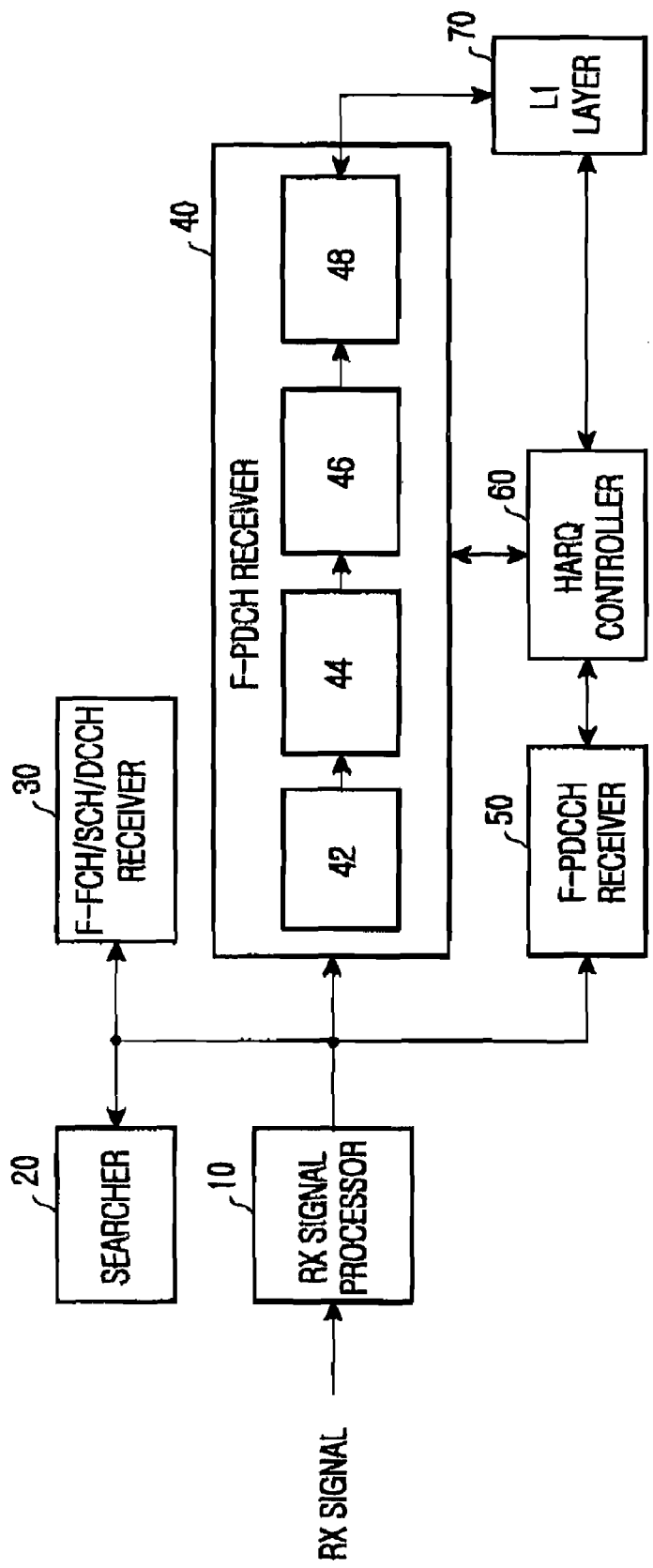
FIG. 1 is a block diagram illustrating an example of a receiver in a mobile communication system.

Several embodiments of the present invention will now be described in detail with reference to the accompanying drawings. In the drawings, the same or similar elements are denoted by the same reference numerals. A detailed description of known functions and configurations incorporated herein has been omitted for conciseness.

Figure 2:
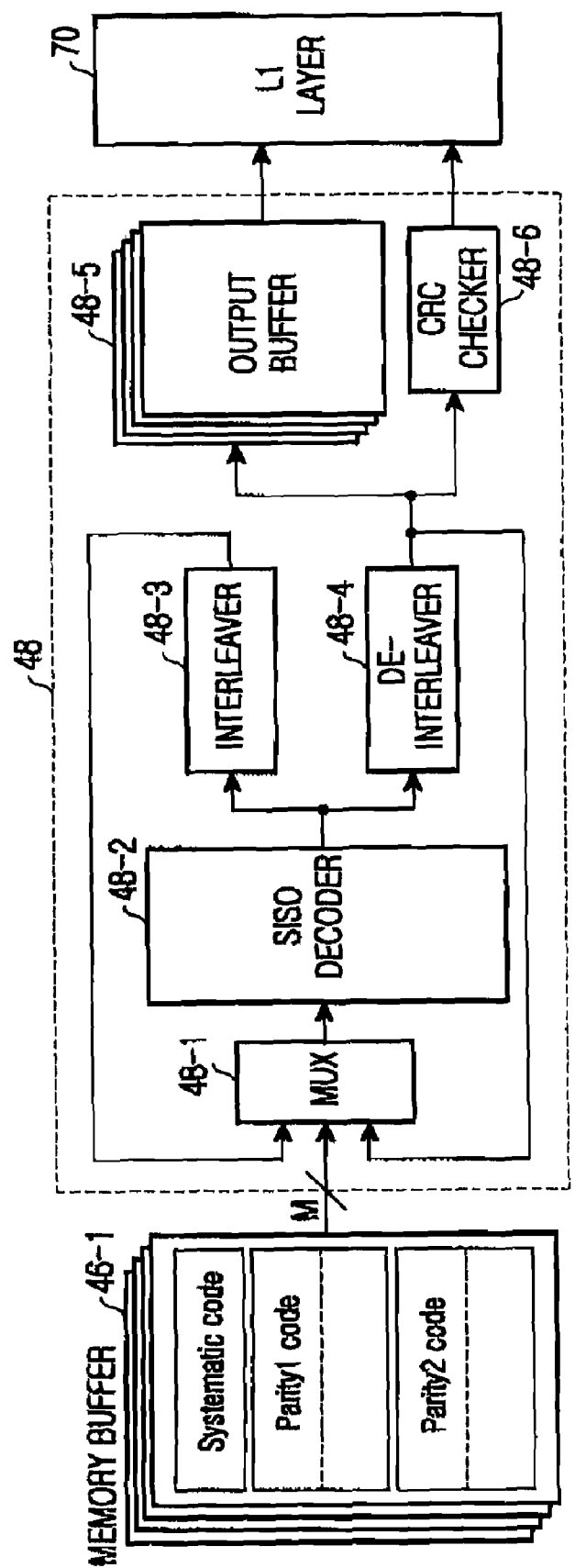
FIG. 2 is a block diagram illustrating an example of a conventional turbo decoder apparatus.
Figure 8:
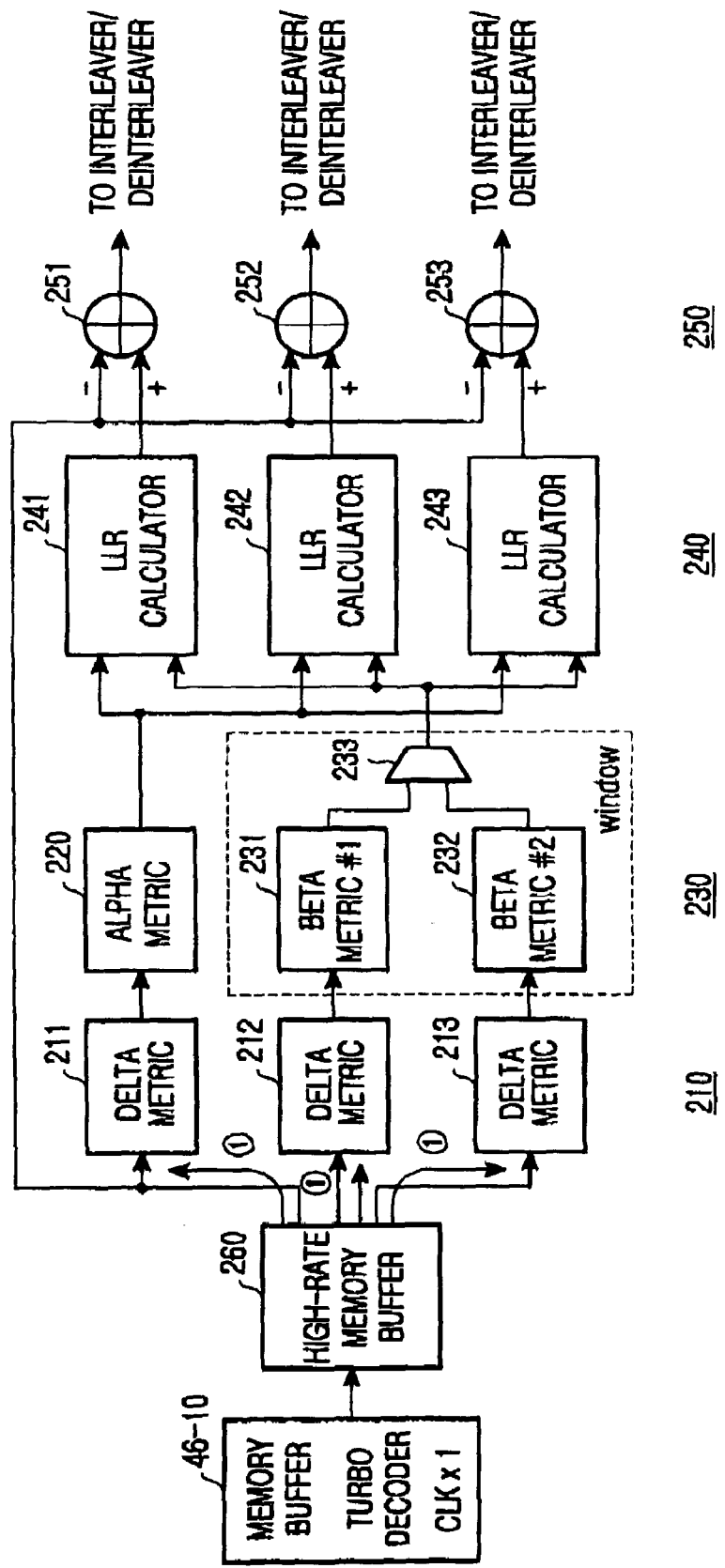
FIG. 8 is a block diagram illustrating an example of a SISO decoder according to an embodiment of the present invention.

FIG. 8 is a block diagram illustrating an example of SISO decoder according to an embodiment of the present invention. The drawing shows only a SISO decoder constituting the turbo decoder shown in FIG. 2 and a memory buffer connected to a previous stage of the SISO decoder.

Figure 3:
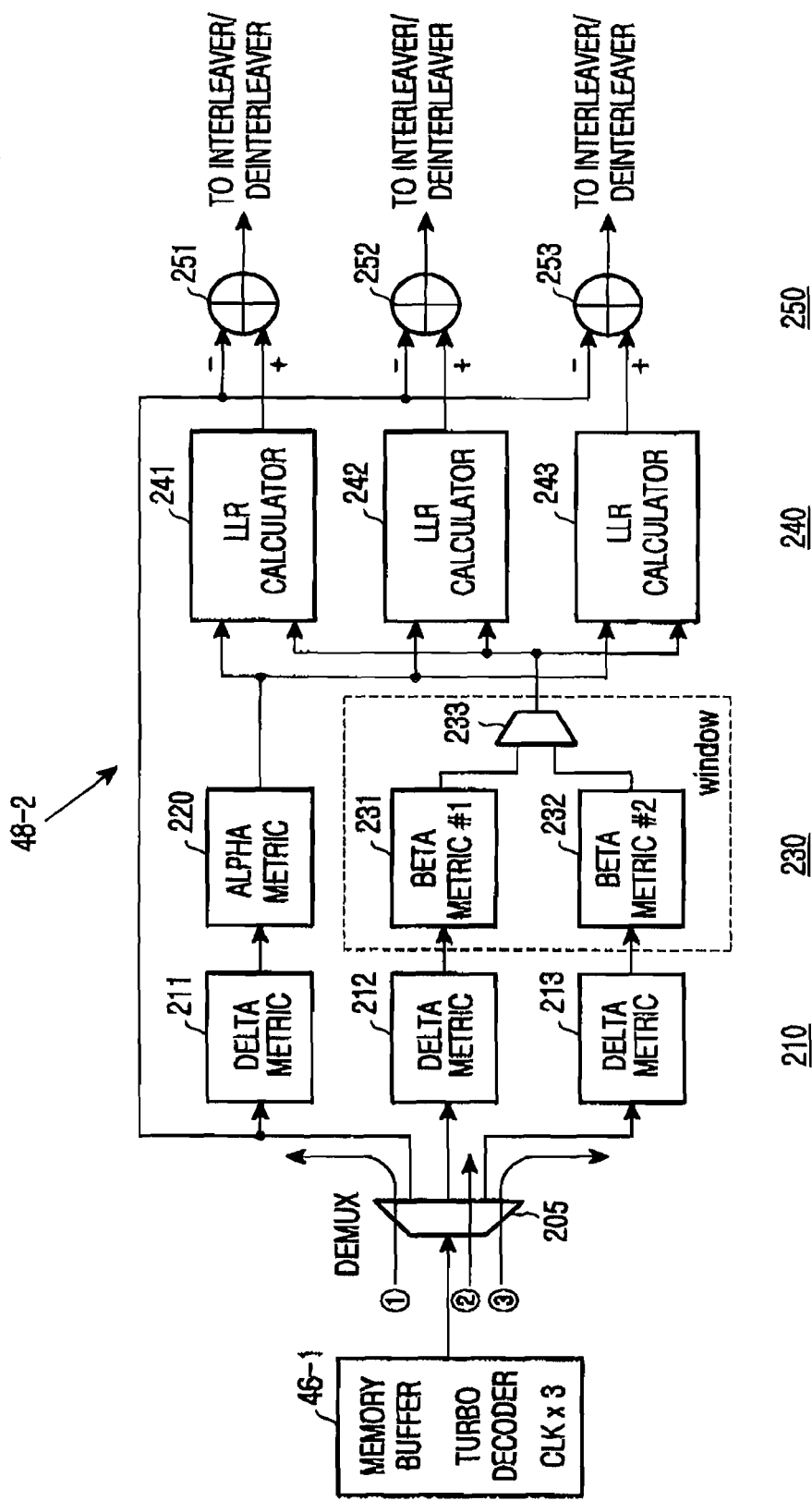
FIG. 3 is a block diagram illustrating an example of a conventional SISO decoder.
Figure 4A:
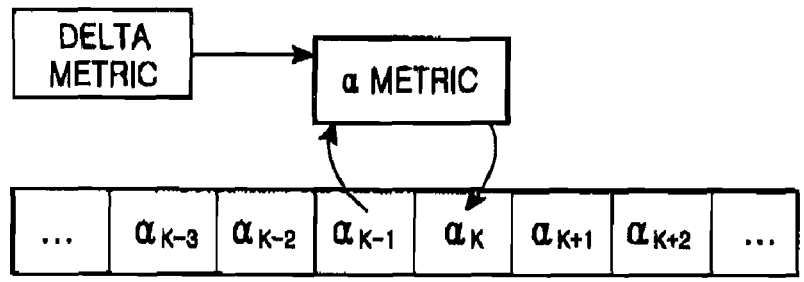
FIGS. 4A and 4B are block diagrams illustrating an example of a metric calculation order performed by the conventional SISO decoder.
Figure 4B:
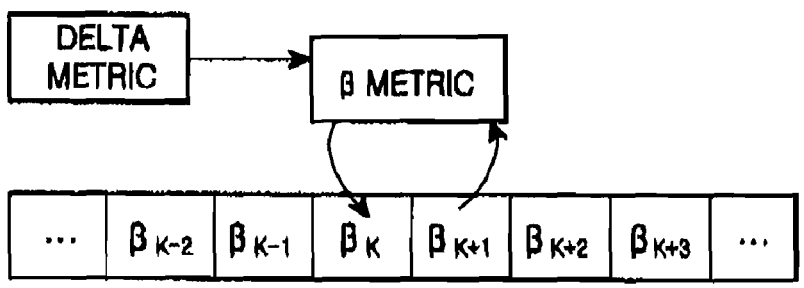
Figure 5A:
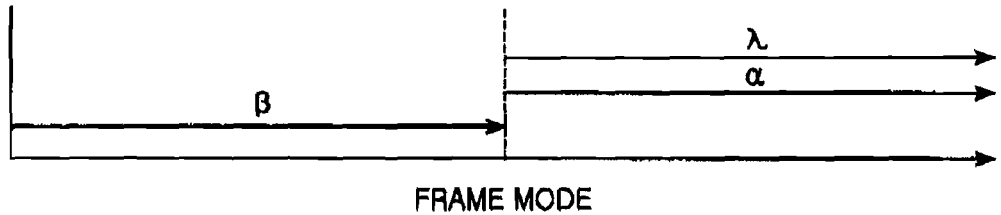
FIGS. 5A and 5B are block diagrams illustrating an example of a calculation order in a frame mode and a window mode performed by the conventional SISO decoder.
Figure 5B:
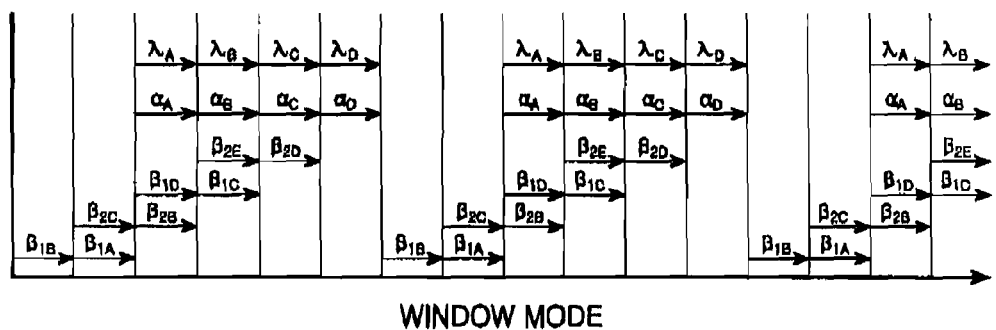
Figure 7:
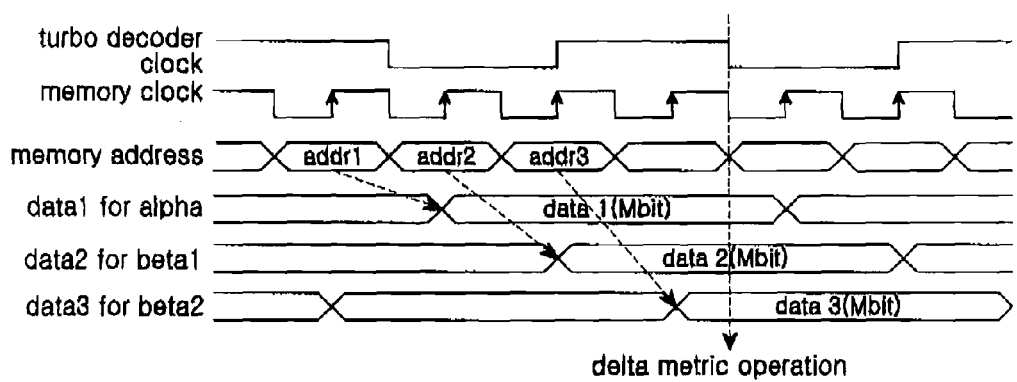
FIG. 7 is a timing diagram illustrating an example of a memory buffer access operation timing performed by the SISO decoder shown in FIG. 3.

Referring to FIG. 8, the decoding apparatus according to an embodiment of the present invention includes a SISO decoder comprised of a delta metric calculation section 210, an alpha metric calculation section 220, a beta metric calculation section 230, an LLR calculation section 240, and a subtraction section 250. The decoding apparatus is characterized by further including a high-rate memory buffer 260 between the SISO decoder and a memory buffer 46-10 that stores received symbols (or data bits) as described in FIG. 3. In addition, the memory buffer 46-10 of the decoding apparatus is featured by operating at a rate of {1× clock of turbo decoder} rather than at a rate of {3× clock of turbo decoder} of the memory buffer 46-1 in the conventional decoding apparatus (see FIGS. 7 and 11). That is, the proposed decoding apparatus is characterized by additionally arranging the high-rate memory buffer 260 after the memory buffer 46-10 to access received data bits stored in different positions of the memory buffer 46-10 for 1 clock of the turbo decoder and provide the accessed data bits to respective calculators 211 to 213 of the delta metric calculation section 210 so that a delta metric calculation operation by the delta metric calculation section 210 is performed for 1 clock of the turbo decoder.

Figure 6:
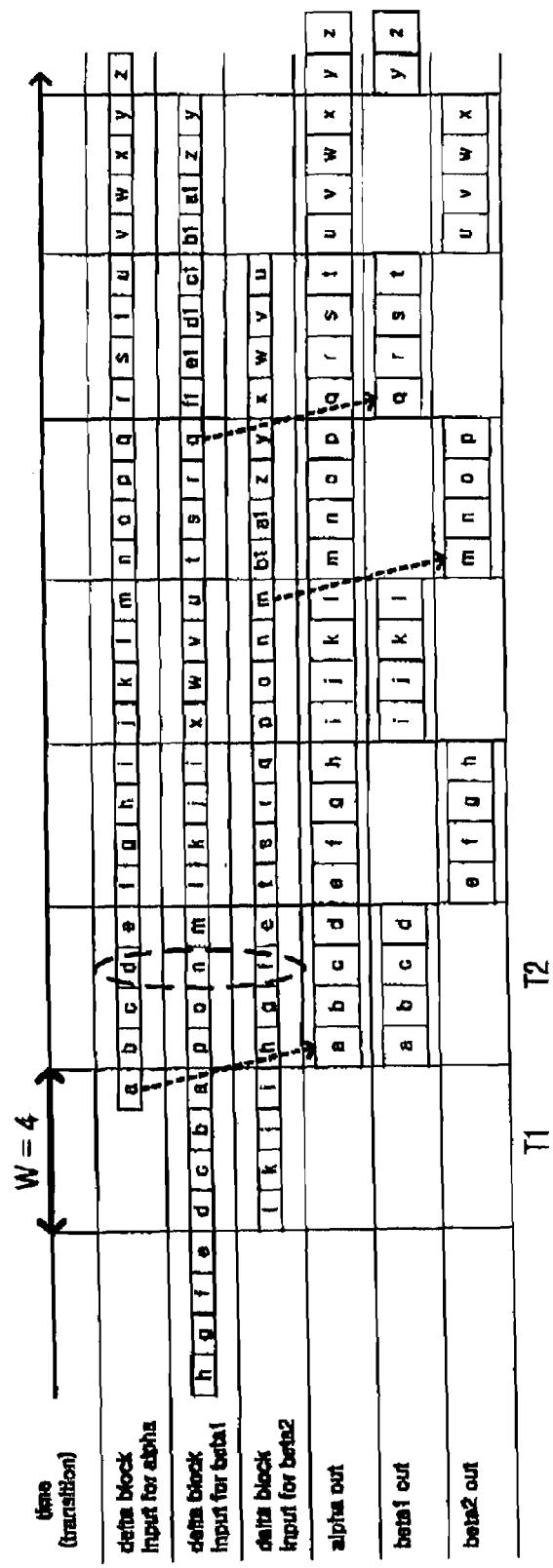
FIG. 6 is a block diagram illustrating an example of a processing flow of a data bit input and a metric output performed by the SISO decoder shown in FIG. 3.

The proposed decoding apparatus, though used in a communication system providing a high-speed packet data service such as a 1x EV-DV system, is not required to increase an operating frequency of the memory buffer. Thus, the decoding apparatus is suitable to enable a mobile communication terminal to consume less power. For reference, in the conventional decoding apparatus of FIG. 3, since received data bits are directly connected to the turbo decoder via the demultiplexer 205 connected to the memory buffer 46-1 of the receiver, a data reading operation from the memory buffer 46-1 of the receiver is performed three times as illustrated in FIG. 6. However, the decoding apparatus proposed in the invention is featured by additionally arranging the memory buffer 260 instead of the demultiplexer in an input stage of the decoder, thereby enabling a normal operation of the SISO decoder through one reading operation for one clock. That is, the proposed decoding apparatus requires only one memory reading operation in calculating three delta metrics, and this operation is identical to an operating clock of the turbo decoder. Such an operation is possible because the high-rate memory buffer 260 previously stores a received signal therein and then rearranges the received signal to be matched with an input desired by the delta metric calculators 211 to 213.

Since the structure of the SISO decoder has been described before, a detailed description thereof will be omitted, and a description of invention will now be focused on a structure and operation of the high-rate memory buffer 260 in relation to the invention.

Figure 9:
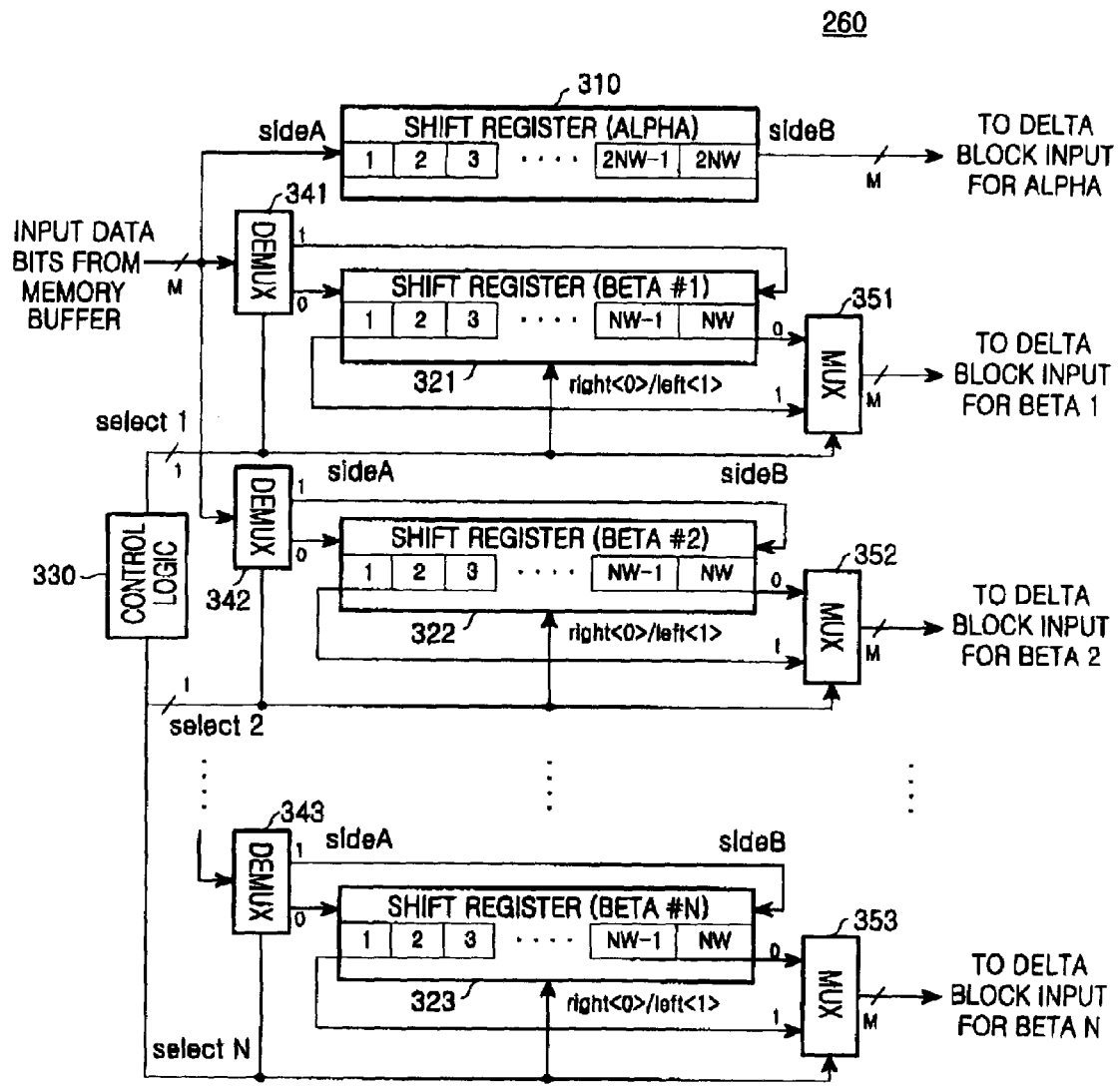
FIG. 9 is a block diagram illustrating an example of the high-rate memory buffer shown in FIG. 8 according to an embodiment of the present invention.
Figure 12:
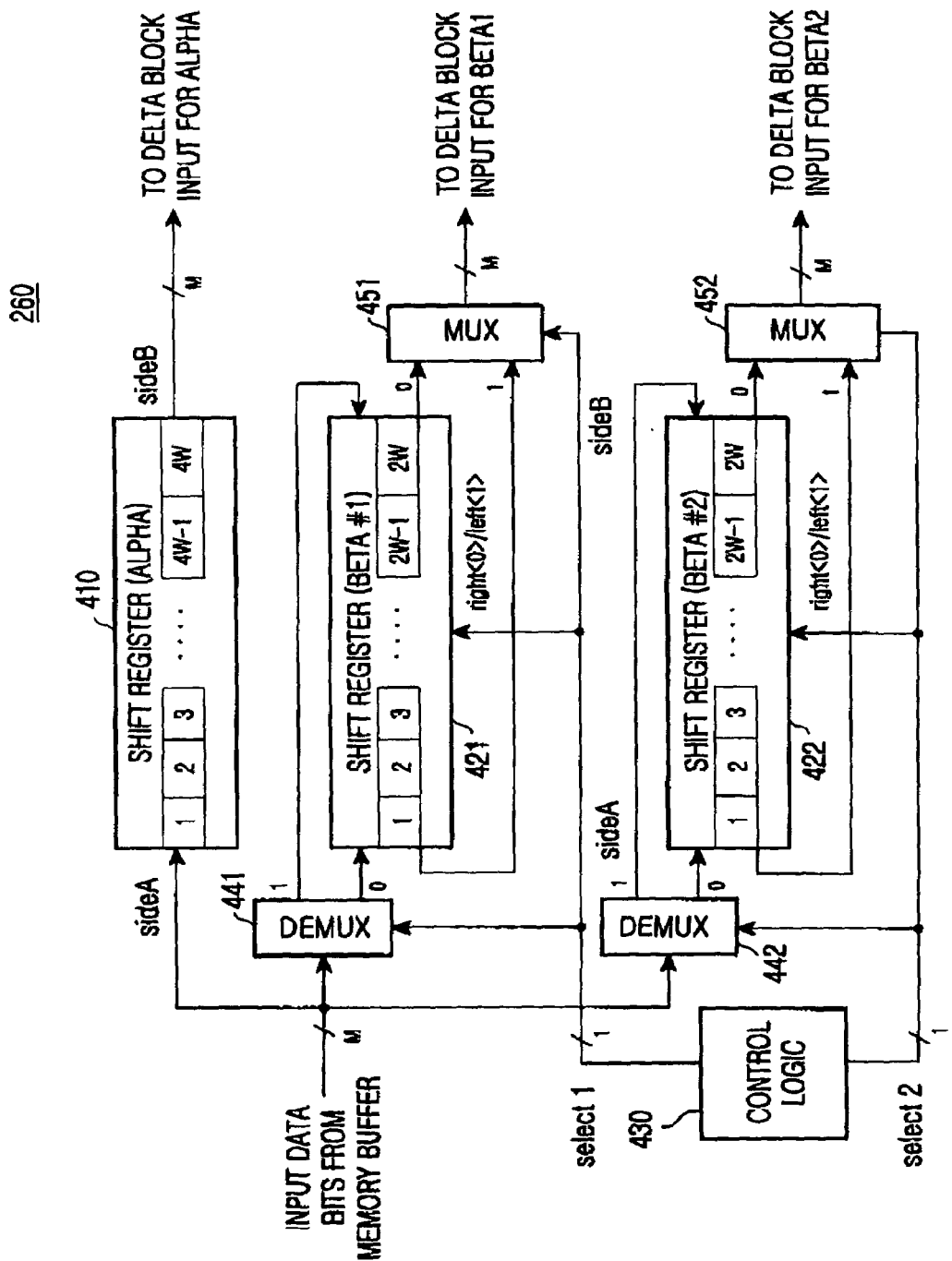
FIG. 12 is a block diagram illustrating another example of a structure of the high-rate memory buffer shown in FIG. 8 according to an embodiment of the present invention.
Figure 17:
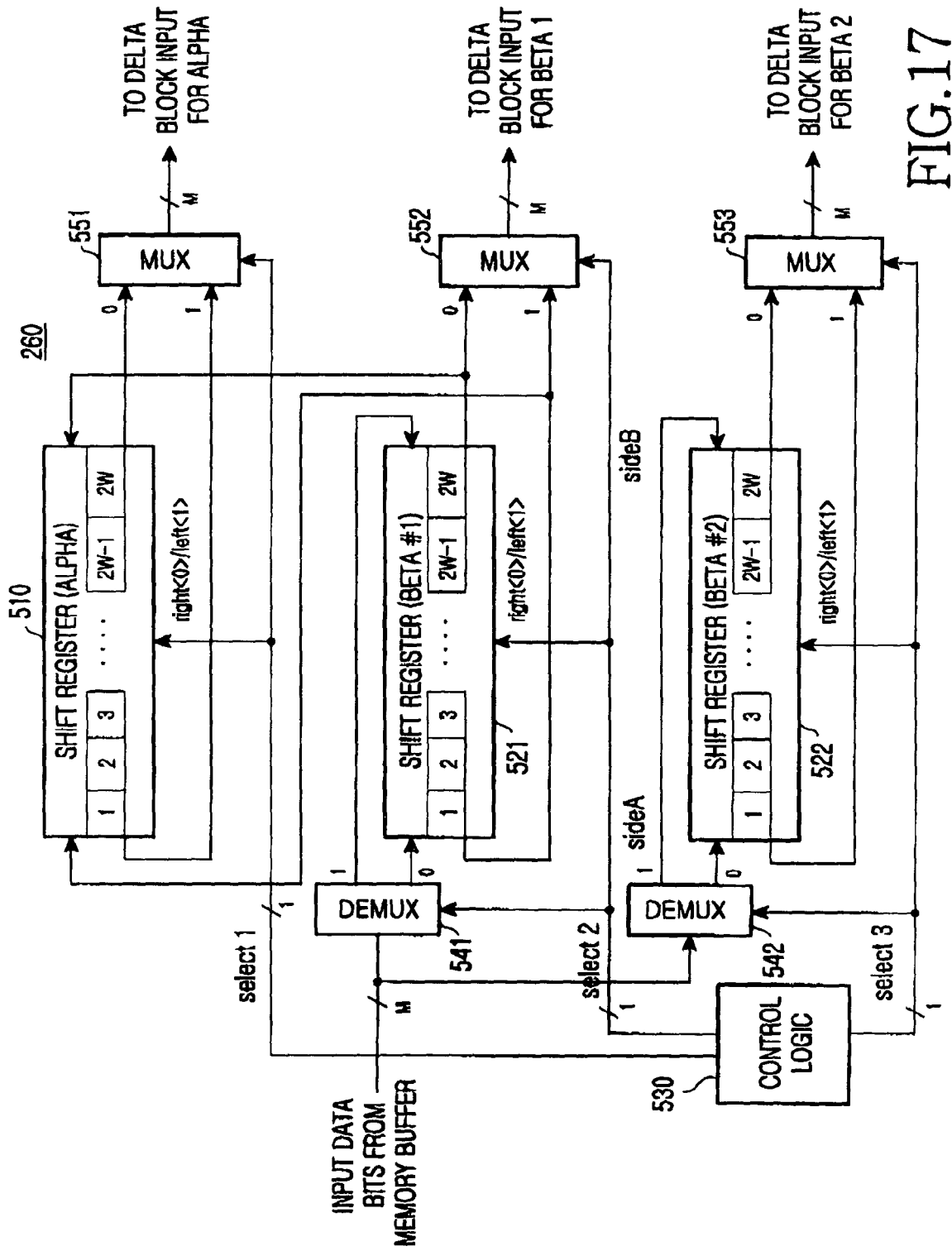
FIG. 17 is a block diagram illustrating another example of the high-rate memory buffer shown in FIG. 8 according to an embodiment of the present invention.

The high-rate memory buffer 260 of the proposed decoding apparatus can be constructed as illustrated in FIGS. 9, 12 and 17. FIG. 9 shows an embodiment in which the high-rate memory buffer 260 is comprised of one unidirectional shift register 310 and as many bidirectional shift registers 321, 322 and 323 as the number N of windows. FIG. 12 shows an embodiment in which the high-rate memory buffer 260 is comprised of one unidirectional shift register 410 and as many bidirectional shift registers 421 and 422 as the number 2 of windows. The structures shown in FIGS. 9 and 12 are identical in principle, but different in the number of windows. FIG. 17 shows an embodiment in which the high-rate memory buffer 260 is comprised of one bidirectional shift register 510 and as many bidirectional shift registers 521 and 522 as the number 2 of windows. The structure shown in FIG. 17 is different in principle from the structures shown in FIGS. 9 and 12. In the structures shown in FIGS. 9 and 12, data bits from the memory buffer 46-10 are simultaneously applied to the unidirectional shift register and the bidirectional shift registers. On the contrary, in the structure shown in FIG. 17, data bits from the memory buffer 46-10 are applied to the bidirectional shift registers 521 and 522, and data bits output from the bidirectional shift registers 521 and 522 are applied to the bidirectional shift register 510 corresponding to the unidirectional shift registers 310 and 410 in first and second embodiments.

The first, second and third embodiments of FIGS. 9, 12, and 17, respectively, are disclosed in more detail below.

First Embodiment

FIG. 9 is a block diagram illustrating an example of a structure of the high-rate memory buffer 260 shown in FIG. 8 according to a first embodiment of the present invention. Referring to FIG. 9, the high-rate memory buffer 260 is comprised of one unidirectional shift register 310, N bidirectional shift registers 321 to 323, a control logic 330, demultiplexers (DEMUX) 341 to 343, and multiplexers (MUX) 351 to 353.

The unidirectional shift register 310 has 2NW storage areas (length), and includes an input terminal for data input and an output terminal for data output. Here, N is the number of windows and W is a size of the windows. The size W of the windows can be changed. However, even though the size W of the windows is changed, a ratio (e.g., 2W and 4W) of shift registers is not changed. For W=24, the unidirectional shift register 310 for α has a size of 96, and shift registers 321 to 323 for β1 and β2 have a size of 48. When W is changed, a length of the shift registers is changed accordingly, and a data processing flow will also be changed. However, even though W is changed, a structure of the shift registers is not changed. The unidirectional shift register 310 sequentially receives input data bits from the memory buffer 46-10 through the input terminal according to a predetermined clock of the turbo decoder, and shifts the received input data bits from the left (side A) to the right (side B). When data bit streams of a first length (2NW) are formed, the unidirectional shift register 310 sequentially outputs the formed data bit streams of the first length through the output terminal. Data bits output from the unidirectional shift register 310 are applied to the delta metric calculator 211 connected to a front end of the alpha metric calculation section 220.

The bidirectional shift registers 321 to 323 each have NW storage areas, and include a first terminal and a second terminal for data input/output. The first terminal represents a terminal arranged in the left of each of the bidirectional shift registers 321 to 323, while the second terminal represents a terminal arranged in the right of each of the bidirectional shift registers 321 to 323. The first terminal and the second terminal can support data output as well as data input. The number of the bidirectional shift registers 321 to 323 is determined by the number of windows. If the number of windows is N, the number of the bidirectional shift registers 321 to 323 is determined as N, and if the number of windows is 2, the number of the bidirectional shift registers 321 to 323 is determined as 2. Input data bits from the memory buffer 46-10 are divided into groups each comprised of bits of a second length (NW) which is ½ of the first length. The bidirectional shift registers 321 to 323 each sequentially receive and shift bits of odd-numbered groups among the divided groups through the first terminal from the left (side A) to the right (side B), and if bit streams of the second length are formed, the bidirectional shift registers 321 to 323 each sequentially output the formed bit streams through the first terminal from the right to the left, which is the reverse order of the input order. The bidirectional shift registers 321 to 323 each sequentially receive and shift bits of even-numbered groups among the divided groups through the second terminal from the right to the left, and if bit streams of the second length are formed, the bidirectional shift registers 321 to 323 each sequentially output the formed bit streams through the second terminal from the left to the right, which is the reverse order of the input order.

The demultiplexers 341 to 343 are provided between an output terminal of the memory buffer 46-10 and the shift registers 321 to 323, and the multiplexers 351 to 353 are provided between the shift registers 321 to 323 and the delta metric calculation section 210. Input terminals of the demultiplexers 341 to 343 are connected to the output terminal of the memory buffer 46-10, first output terminals of the demultiplexers 341 to 343 are connected to second terminals of the shift registers 321 to 323, and second output terminals of the demultiplexers 341 to 343 are connected to first terminals of the shift registers 321 to 323. First input terminals of the multiplexers 351 to 353 are connected to second terminals of the shift registers 321 to 323, second input terminals of the multiplexers 351 to 353 are connected to first terminals of the shift registers 321 to 323, and output terminals of the multiplexers 351 to 353 are connected to the delta metric calculators 211 to 213.

The control logic 330 provides select signals select1 to selectN for controlling operations of the shift registers 321 to 323, the demultiplexers 341 to 343 and the multiplexers 351 to 353. The select signals can be designated as signals for controlling input data bits from the memory buffer 46-10 so that the input data bits are applied to the shift registers 321 to 323 at different times. The control logic 330 determines whether the input data bits from the memory buffer 46-10 are bits of odd-numbered groups or bits of even-numbered groups among the divided groups, and applies the input data bits from the memory buffer 46-10 to the first terminals or the second terminals of the shift registers 321 to 323 according to the determination result.

For example, the control logic 330 outputs select signals of "0" or "logic low" level when the input data bits are bits of the odd-numbered groups, and the control logic 330 outputs select signals of "1" or "logic high" level when the input data bits are bits of the even-numbered groups. When select signals of "0" level are output, the demultiplexers 341 to 343 apply the input data bits from the memory buffer 46-10 to the first terminals of the shift registers 321 to 323. Then the shift registers 321 to 323 sequentially shift the data bits received through their first terminals from the left to the right (in the right direction). At the same time, the shift registers 321 to 323 sequentially shift again NW data bits previously received through their second terminals and then stored, from the left to the right, and output the shifted data bits through their second terminals.

When select signals of "1" level are output, the demultiplexers 341 to 343 apply the input data bits from the memory buffer 46-10 to the second terminals of the shift registers 321 to 323. Then the shift registers 321 to 323 sequentially shift the data bits received through their second terminals from the right to the left (in the left direction). At the same time, the shift registers 321 to 323 sequentially shift again NW data bits previously received through their first terminals and then stored, from the right to the left, and output the shifted data bits through their first terminals.

Data bits output through the first terminals of the shift registers 321 to 323 are applied to the second input terminals of the multiplexers 351 to 353, and data bits output through the second terminals of the shift registers 321 to 323 are applied to the first input terminals of the multiplexers 351 to 353. The multiplexers 351 to 353 multiplex data bits applied through their first input terminals and second input terminals, and output the multiplexed data bits to corresponding delta metric calculators 211 to 213.

As described above, the proposed decoding apparatus applies data bits stored in different positions of the memory buffer 46-10 to the SISO decoder using the high-rate memory buffer 260 having the structure illustrated in FIG. 9. That is, the high-rate memory buffer 260 rearranges the order of previously sequentially received data bits in the order requested by a SISO decoder with a sliding window mode scheme, through the shift registers 310 and 321 to 323.

Referring to FIG. 9, M bits from the memory buffer 46-10 are applied to the shift registers 310 and 321 to 323 having 2NW or NW storage areas. Here, N indicates the number of windows, W indicates a size of the windows, and M indicates the number of data bits received from the memory buffer 46-10 for one clock of the turbo decoder. When the memory buffer 46-10 is a QCTC memory buffer, M is the sum of a bit width of systematic code and a bit width of parity codes. That is, an M-bit signal is a signal created by summing up M/3 bits of a systematic code, M/3 bits of a first parity code, and M/3 bits of a second parity code. For the M-bit signal input, the shift registers 310 and 321 to 323, the demultiplexers 341 to 343, and the multiplexers 351 to 353 are all constructed to have an M-bit width. An output of the M-bit signal, i.e., values output from the shift registers 310 and 321 to 323 are provided to the delta metric calculators 211 to 213. The delta metric calculators 211 to 213 receive three M/3-bit signals, the sum of which is M bits.

Figure 10:
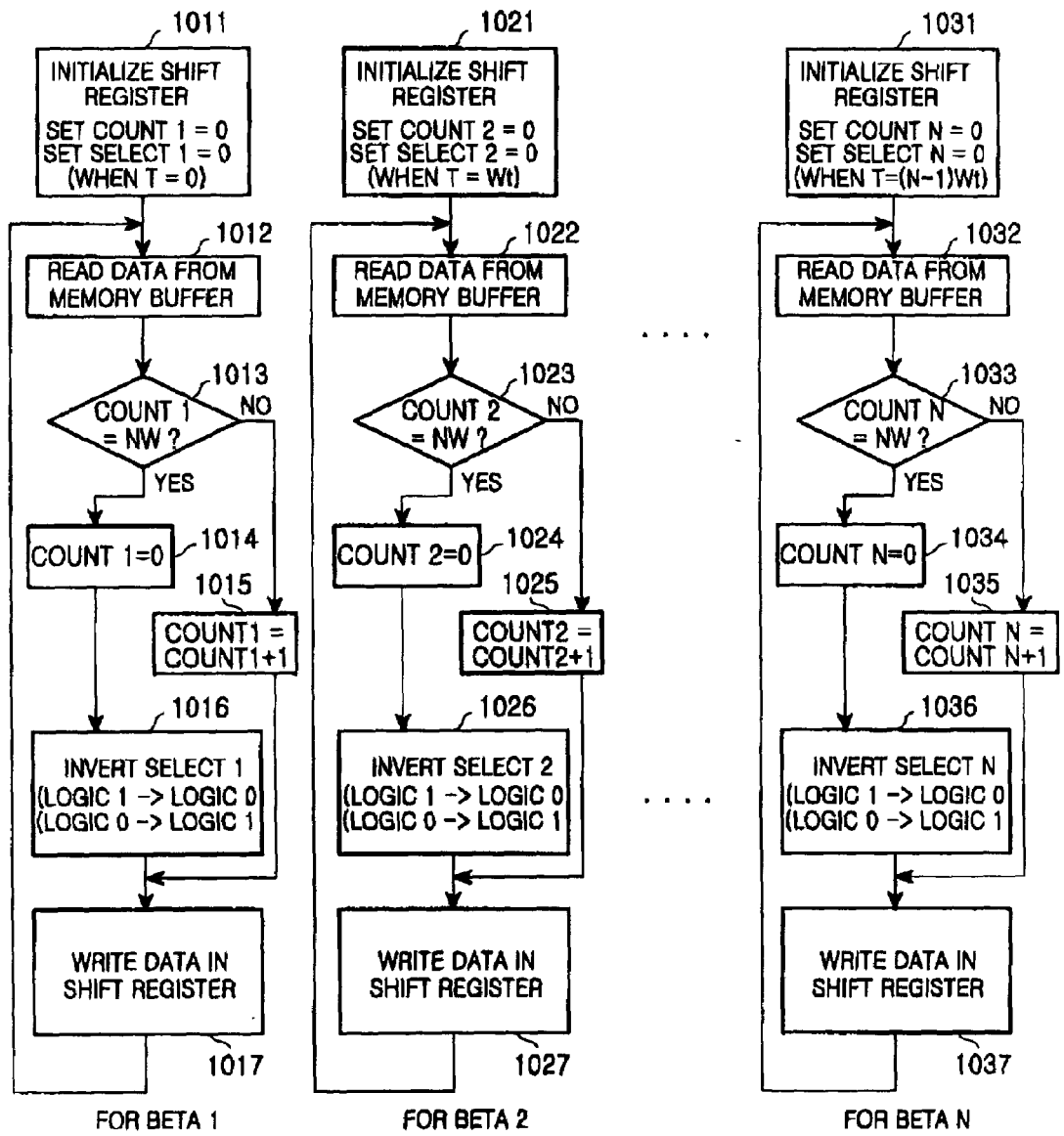
FIG. 10 is a flow chart illustrating an example of a control operation performed by the control logic shown in FIG. 9 according to an embodiment of the present invention.

FIG. 10 illustrates a control operation by the control logic 330 shown in FIG. 9. Specifically, the drawing shows a control flow in which the control logic 330 controls the shift registers 321 to 323 for β metrics, the demultiplexers 341 to 343 connected to front ends and rear ends of the shift registers 321 to 323, and the multiplexers 351 to 353.

In FIG. 10, an operation in steps 1011 to 1017 represents a process flow of an operation of controlling the shift register 321, the demultiplexer 341 and the multiplexer 351. An operation in steps 1021 to 1027 represents a process flow of an operation of controlling the shift register 322, the demultiplexer 342 and the multiplexer 352. An operation in steps 1031 to 1037 represents a process flow of an operation of controlling the shift register 323, the demultiplexer 343 and the multiplexer 353. Since the respective process flows are identical in their operations except their start times and names of the signals used, only the process flow in steps 1011 to 1017 will be described herein for simplicity. For such a control operation, counters corresponding to the shift registers 321 to 323 are included in the control logic 330. The counters are initialized at different times with a predetermined offset of W to perform a counting operation. A counter1 corresponding to the shift register 321 is initialized at a time T=0, a counter2 corresponding to the shift register 322 is initialized at a time T=Wt, and a counter #N corresponding to the shift register 323 is initialized at a time T=(N−1)Wt. Here, t represents a time, i.e., a unit clock.

Referring to FIG. 10, in step 1011, the control logic 330 initializes the shift register 321. During the initialization operation, a count value of the counter1 is initialized to count1=0, and a select signal select1 is initialized to select1=0. In addition, a left (side A) terminal of the shift register 321 is designated as an input terminal, while a right (side B) terminal of the shift register 321 is designated as an output terminal. In step 1012, the control logic 330 reads data bits by accessing the memory buffer 46-10 of FIG. 8. In step 1013, the control logic 330 examines whether the count value is count1=NW in order to determine whether the shift register 321 is full. If the count value is count1=NW, the control logic 330 sets the count value count1 to 0 in step 1014. If the count value is not count1=NW, the control logic 330 increase the count value count1 by 1 in step 1015. After the step 1014, the control logic 330 inverts the signal select1 in step 1016. That is, the control logic 330 converts a signal select1 of "1" into a signal select1 of "0" and a signal select1 of "0" into a signal select1 of "1" by inverting the signal select1. By the operation of step 1016, an input/output direction and a shift direction of data bits are changed. After the step 1016 or after the step 1015, the control logic 330 writes data bits received from the memory buffer 46-10 in the shift register 321, in step 1017. After the step 1017, the control logic 330 returns to step 1012 to repeatedly perform the above operation.

Figure 11:
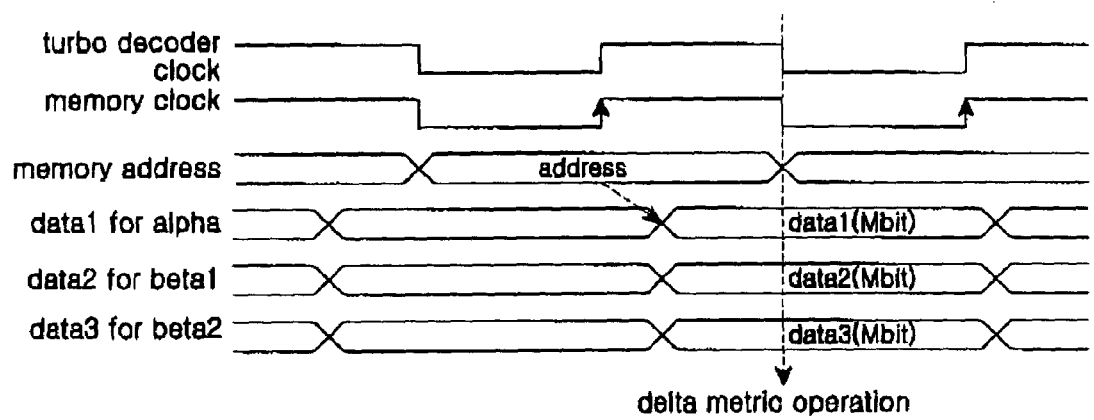
FIG. 11 is a timing diagram illustrating an example of a memory buffer access operation timing performed by the high-rate memory buffer shown in FIG. 9 according to an embodiment of the present invention.

FIG. 11 is a timing diagram illustrating an example of a memory buffer access operation timing performed by the high-rate memory buffer 260 shown in FIG. 9 according to an embodiment of the present invention. Referring to FIG. 11, data bits stored in different position of the memory buffer 46-10 are accessed by the high-rate memory buffer 260. In this example, the high-rate memory buffer 260 accesses data bits data1, data2 and data3 stored in three addresses of the memory buffer 46-10. When the three kinds of data bits data1, data2 and data3 all enter the high-rate memory buffer 260 at the same time within one clock of the turbo decoder, the calculators 211 to 213 of the delta metric calculation section 210 perform an operation of calculating a delta metric at the same time. The data bit data1 (M bits) refers to systematic code (M/3 bits)+parity1 code (M/3 bits)+parity2 code (M/3 bits), and the data2 and data3 are also equal to the data1.

Second Embodiment

FIG. 12 is a block diagram illustrating another example of a structure of the high-rate memory buffer 260 shown in FIG. 8 according to a second embodiment of the present invention. The drawing shows a structure of the high-rate memory buffer 260 when the number of windows is N=2, i.e., when beta has two windows.

Referring to FIG. 12, the high-rate memory buffer 260 is comprised of one unidirectional shift register 410, N=2 bidirectional shift registers 421 and 422, a control logic 430, demultiplexers (DEMUX) 441 and 442, and multiplexers (MUX) 451 and 452.

The shift register 410 has 2NW=4W storage areas (length), and includes an input terminal for data input and an output terminal for data output. The shift register 410 sequentially receives input data bits from the memory buffer 46-10 through the input terminal according to a clock of the turbo decoder, and shifts the received input data bits from the left (side A) to the right (side B). When data bit streams of a first length (4W) are formed, the shift register 410 sequentially outputs the formed data bit streams of the first length through the output terminal. Data bits output from the shift register 410 are applied to the delta metric calculator 211 connected to a front end of the alpha metric calculation section 220.

The shift registers 421 and 422 each have NW=2W storage areas, and include a first terminal and a second terminal for data input/output. The first terminal represents a terminal arranged in the left of each of the shift registers 421 and 422, while the second terminal represents a terminal arranged in the right of each of the shift registers 421 and 422. The first terminal and the second terminal can support data output as well as data input. The number of the shift registers 421 and 422 is determined by the number of windows. If the number of windows is N=2, the number of the shift registers 421 and 422 is determined as 2. Input data bits from the memory buffer 46-10 are divided into groups each comprised of bits of a second length (2W) which is ½ of the first length. The shift registers 421 and 422 each sequentially receive and shift bits of odd-numbered groups among the divided groups through the first terminal from the left (side A) to the right (side B), and if bit streams of the second length are formed, the shift registers 421 and 422 each sequentially output the formed bit streams through the first terminal from the right to the left, the reverse order of the input order. The shift registers 421 and 422 each sequentially receive and shift bits of even-numbered groups among the divided groups through the second terminal from the right to the left, and if bit streams of the second length are formed, the shift registers 421 and 422 each sequentially output the formed bit streams through the second terminal from the left to the right, the reverse order of the input order.

The demultiplexers 441 and 442 are provided between an output terminal of the memory buffer 46-10 and the shift registers 421 and 422. The multiplexers 451 and 452 are provided between the shift registers 421 and 422 and the delta metric calculation section 210. Input terminals of the demultiplexers 441 and 442 are connected to the output terminal of the memory buffer 46-10, first output terminals of the demultiplexers 441 and 442 are connected to second terminals of the shift registers 421 and 422, and second output terminals of the demultiplexers 441 and 442 are connected to first terminals of the shift registers 421 and 422. First input terminals of the multiplexers 451 and 452 are connected to second terminals of the shift registers 421 and 422, second input terminals of the multiplexers 451 and 452 are connected to first terminals of the shift registers 421 and 422, and output terminals of the multiplexers 451 and 452 are connected to the delta metric calculators 211 to 213.

The control logic 430 provides select signals select1 and select2 for controlling operations of the shift registers 421 and 422, the demultiplexers 441 and 442, and the multiplexers 451 and 452. The select signals can be designated as signals for controlling input data bits from the memory buffer 46-10 so that the input data bits are applied to the shift registers 421 and 422 at different times. The control logic 430 determines whether the input data bits from the memory buffer 46-10 are bits of odd-numbered groups or bits of even-numbered groups among the divided groups, and applies the input data bits from the memory buffer 46-10 to the first terminals or the second terminals of the shift registers 421 and 422 according to the determination result.

For example, the control logic 430 outputs select signals of "0" or "logic low" level when the input data bits are bits of the odd-numbered groups, and the control logic 430 outputs select signals of "1" or "logic high" level when the input data bits are bits of the even-numbered groups. When select signals of "0" level are output, the demultiplexers 441 and 442 apply the input data bits from the memory buffer 46-10 to the first terminals of the shift registers 421 and 422. Then the shift registers 421 and 422 sequentially shift the data bits received through their first terminals from the left to the right (in the right direction). At the same time, the shift registers 421 and 422 sequentially shift again 2W data bits previously received through their second terminals and then stored, from the left to the right, and output the shifted data bits through their second terminals.

When select signals of "1" level are output, the demultiplexers 441 and 442 apply the input data bits from the memory buffer 46-10 to the second terminals of the shift registers 421 and 422. Then the shift registers 421 and 422 sequentially shift the data bits received through their second terminals from the right to the left (in the left direction). At the same time, the shift registers 421 and 422 sequentially shift again 2W data bits previously received through their first terminals and then stored, from the right to the left, and output the shifted data bits through their first terminals.

Data bits output through the first terminals of the shift registers 421 and 422 are applied to the second input terminals of the multiplexers 451 and 452, and data bits output through the second terminals of the shift registers 421 and 422 are applied to the first input terminals of the multiplexers 451 and 452. The multiplexers 451 and 452 multiplex data bits applied through their first input terminals and second input terminals, and output the multiplexed data bits to corresponding delta metric calculators 211 to 213.

Referring to FIG. 8, the calculators 211 to 213 of the first metric calculation section 210 receive output bits of the shift registers 410, 421 and 422, and calculate corresponding delta metrics. The second metric calculation section 220 calculates an alpha metric by receiving a delta metric from the calculator 211 of the first metric calculation section 210, corresponding to the shift register 410. The third metric calculation section 230 calculates beta metrics by receiving delta metrics from the calculators 212 and 213 of the first metric calculation section 210, corresponding to the shift registers 421 and 422. The calculators 241 to 243 of the fourth metric calculation section 240 calculate LLR values corresponding to the shift registers 410, 421 and 422 by receiving the alpha metric and a multiplexing result of the beta metrics by the multiplexer 233. The subtracters 251 to 253 of the subtraction section 250 subtract an output of the shift register 410 from the respective LLR values, and output the subtraction results for interleaving and deinterleaving.

Figure 13:
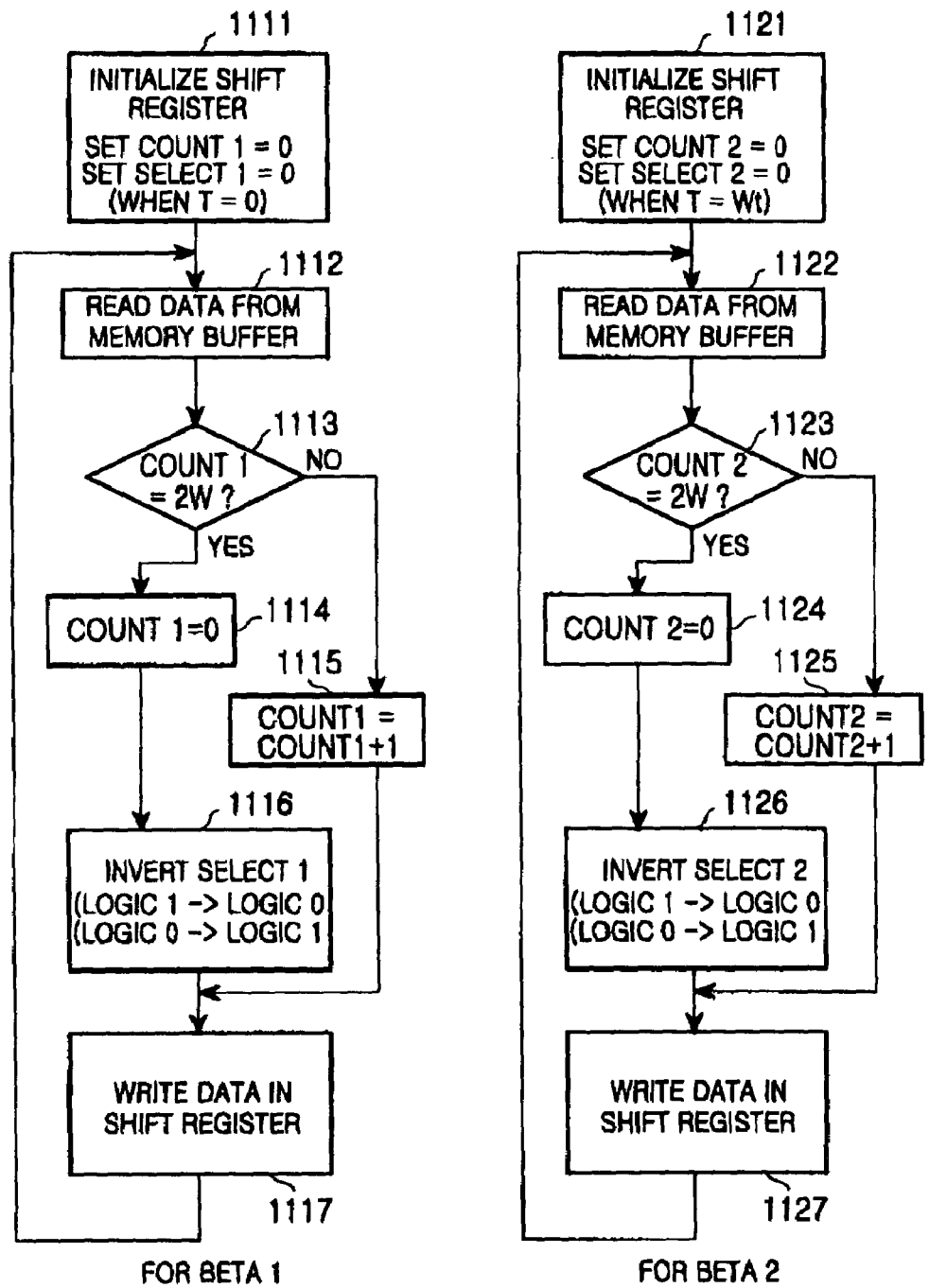
FIG. 13 is a flow chart illustrating an example of a control operation performed by the control logic shown in FIG. 12 according to an embodiment of the present invention.

FIG. 13 is a flow chart illustrating an example of a control operation performed by the control logic 430 shown in FIG. 12 according to an embodiment of the present invention. Specifically, the drawing shows a control flow in which the control logic 430 controls the bidirectional shift registers 421 and 422 for β metrics, the demultiplexers 441 and 442 connected to front ends and rear ends of the shift registers 421 and 422, and the multiplexers 451 and 452.

In FIG. 13, an operation in steps 1111 to 1117 represents a process flow of an operation of controlling the shift register 421, the demultiplexer 441 and the multiplexer 451. An operation in steps 1121 to 1127 represents a process flow of an operation of controlling the shift register 422, the demultiplexer 442 and the multiplexer 452. Since the respective process flows are identical in their operations except their start times and names of the signals used, only the process flow in steps 1111 to 1117 will be described herein for simplicity. For such a control operation, counters corresponding to the shift registers 421 and 422 are included in the control logic 430. The counters are initialized at different times with a predetermined offset of W to perform a counting operation. A counter1 corresponding to the shift register 421 is initialized at a time T=0, and a counter2 corresponding to the shift register 422 is initialized at a time T=Wt. Here, t represents a time, i.e., a unit clock.

Referring to FIG. 13, in step 1111, the control logic 430 initializes the shift register 421. During the initialization operation, a count value of the counter1 is initialized to count1=0, and a select signal select1 is initialized to select1=0. In addition, a left (side A) terminal of the shift register 421 is designated as an input terminal, while a right (side B) terminal of the shift register 421 is designated as an output terminal. In step 1112, the control logic 430 reads data bits by accessing the memory buffer 46-10 of FIG. 8. In step 1113, the control logic 430 examines whether the count value is count1=2W in order to determine whether the shift register 421 is full. If the count value is count1=2W, the control logic 430 sets the count value count1 to 0 in step 1114. If the count value is not count1=2W, the control logic 430 increase the count value count1 by 1 in step 1115. After the step 1114, the control logic 430 inverts the signal select1 in step 1116. That is, the control logic 430 converts a signal select1 of "1" into a signal select1 of "0" and a signal select1 of "0" into a signal select1 of "1" by inverting the signal select1. By the operation of step 1116, an input/output direction and a shift direction of data bits are changed. After the step 1116 or after the step 1115, the control logic 430 writes data bits received from the memory buffer 46-10 in the shift register 421, in step 1117. After the step 1117, the control logic 430 returns to step 1112 to repeatedly perform the above operation.

Figure 14:
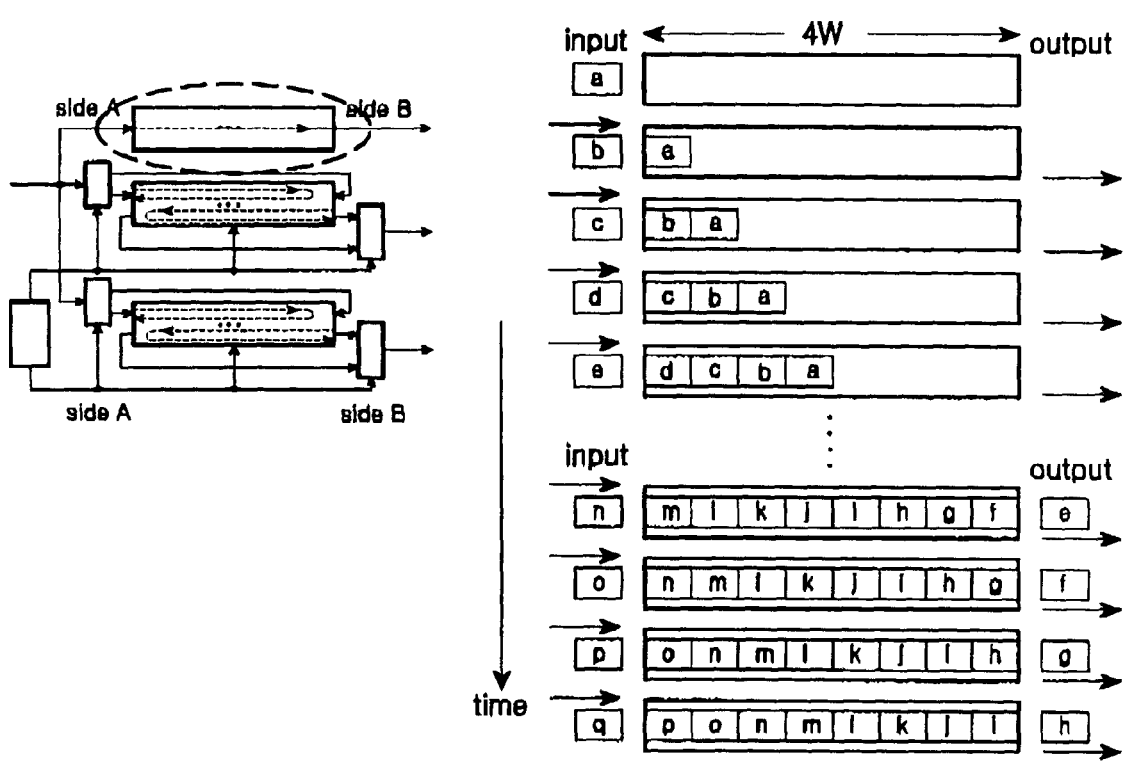
FIG. 14 is a block diagram illustrating an example of a data processing flow performed the shift register for an alpha metric, shown in FIG. 12 according to an embodiment of the present invention.

FIG. 14 is a block diagram illustrating an example of a data processing flow performed by the shift register 410 for an alpha metric, shown in FIG. 12. Referring to FIG. 14, the shift register 410 sequentially receives and shifts data bits from the memory buffer 46-10 of FIG. 8 from the left to the right. In the drawing, "side A" a position where data bits are input, and "side B" represents a position where data bits are output. When data bits are input to the shift register 410, the input data bits are output after being delayed by 4W. The shift register 410 simply has a (FIFO) First-In First-Out structure.

Figure 15:
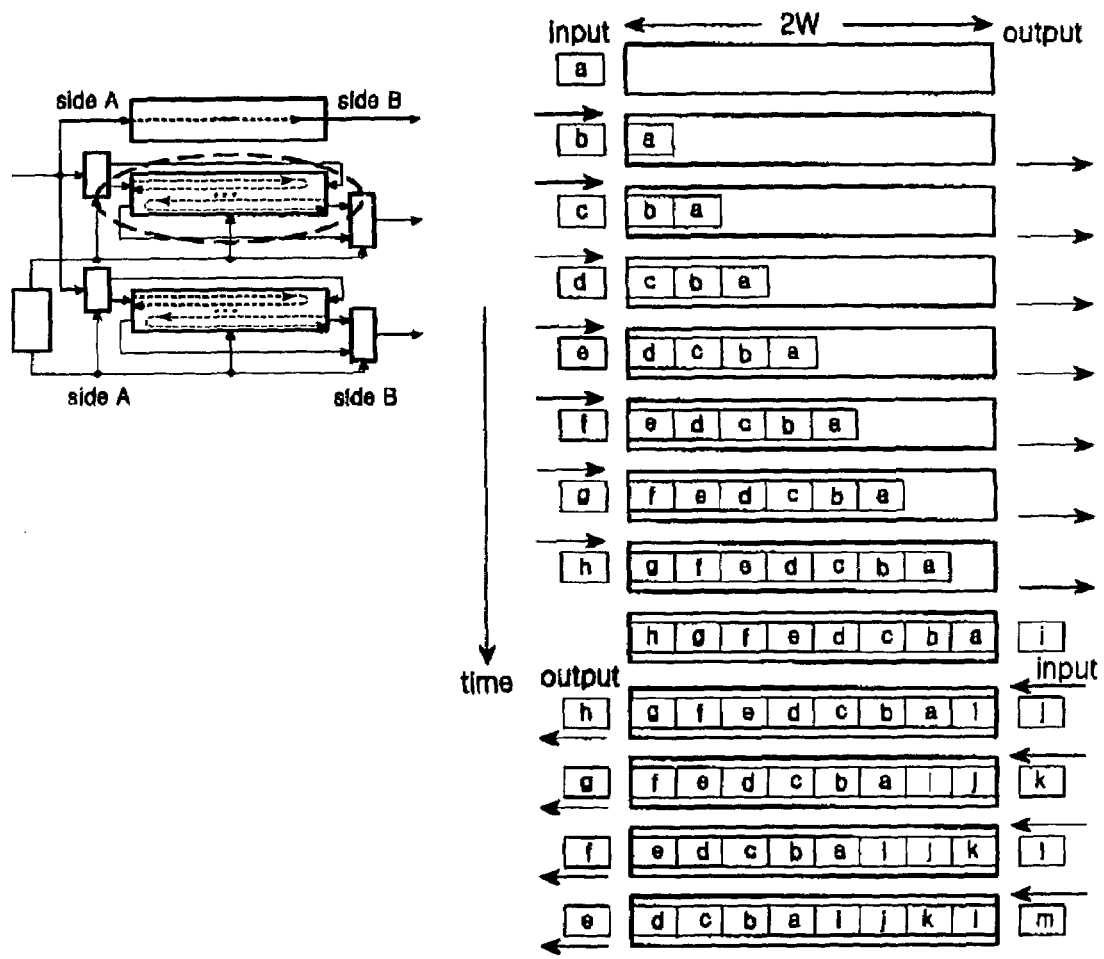
FIG. 15 is a block diagram illustrating an example of a data processing flow performed the shift register for a beta metric, shown in FIG. 12 according to an embodiment of the present invention.

FIG. 15 illustrates a data processing flow by the shift register 421 for a beta metric, shown in FIG. 12. This data processing flow is identical to a data processing flow for the other shift register 422 for a beta metric.

Referring to FIG. 15, the shift register 421 delays data sequentially read from the memory buffer 46-10 for a predetermined time in order to match a data output time to a time desired by the turbo decoder. The shift register 421 sequentially stores input data bits. If the shift register 421 is full, the shift register 421 outputs previous data bits while shifting the stored data bits in the opposite direction of an input direction, and the output data bits are provided to the delta metric calculator 212. As a result, an empty space occurs in the opposite side of the shift register 421. Such an empty space is filled again as new data bits are input in the opposite direction of an input direction in which the previous data bits were input. In this way, data input and output operations of the shift register 421 are repeated, and as a result, data bits are provided to the corresponding delta metric calculator 212 according to the data flow illustrated in the drawing.

Figure 16:
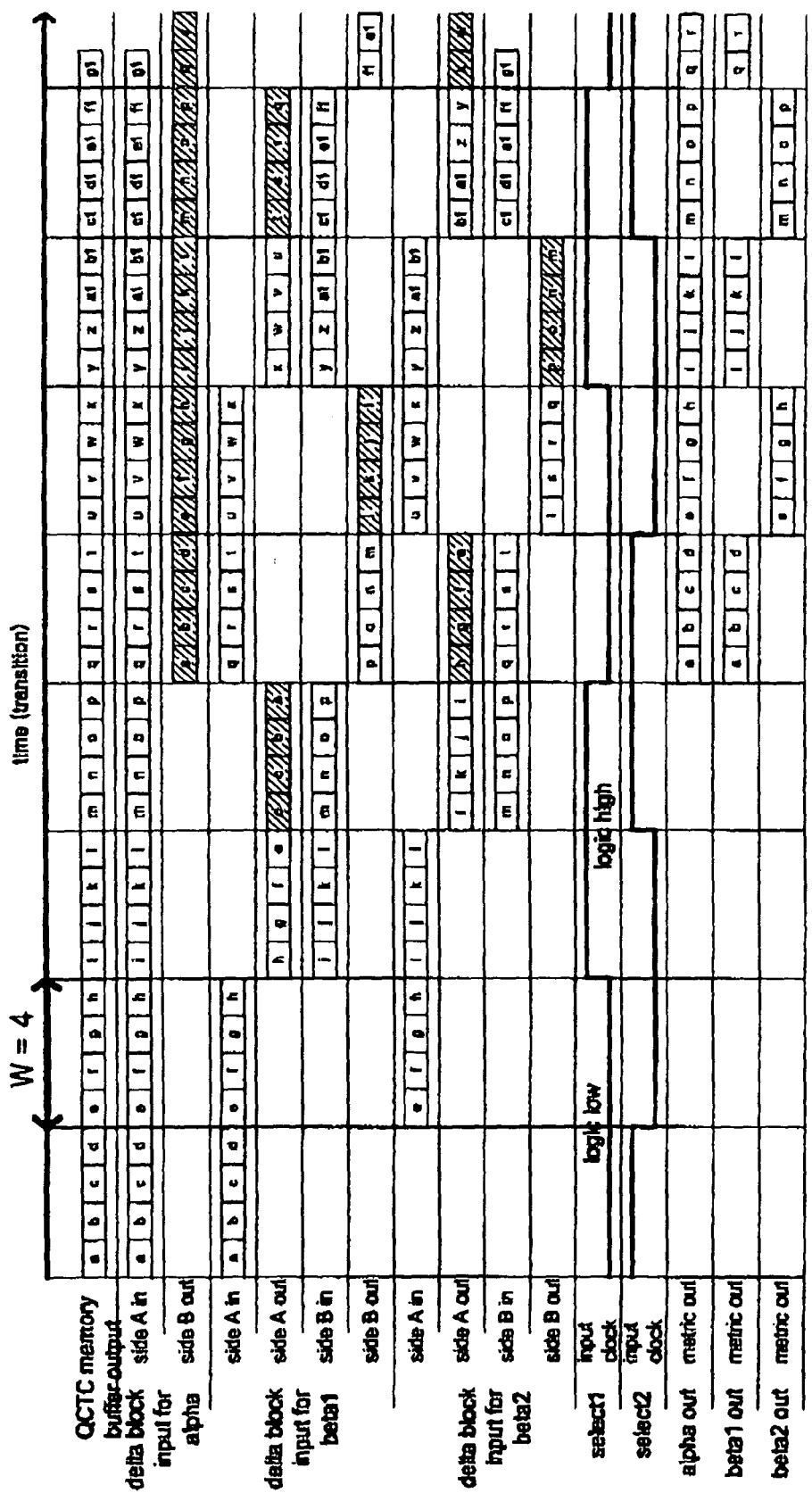
FIG. 16 is a block diagram illustrating an example of a memory buffer access operation timing performed by the high-rate memory buffer shown in FIG. 12 according to an embodiment of the present invention.

FIG. 16 is a block diagram illustrating an example of a memory buffer access operation timing performed by the high-rate memory buffer 260 shown in FIG. 12 according to an embodiment of the present invention. In FIG. 16, "delta block input for alpha" represents input/output data bits of the unidirectional shift register 410 of FIG. 12, wherein "side A in" indicates input data bits while "side B out" indicates output data bits. In addition, "delta block input for beta1" represents input/output data bits of the bidirectional shift register 421, and "delta block input for beta2" represents input/output data bits of the bidirectional shift register 422. In "delta block input for beta1" and "delta block input for beta2," "side A in" and "side A out" indicate data bits being input/output through the first terminal, while "side B in" and "side B out" indicate data bits being input/output through the second terminal. "select1" and "select2" represent control signals which were generated by the control logic 430 and then provided to the shift registers 421 and 422. "α out," "β1 out" and "β2 out" represent finally output metrics, and an LLR value is calculated using such output metrics.

In the "delta block input for beta1" part, data bits are input through side A at the initial stage. The data bits are input in order of a, b, c, d, . . . , h, and the data bits are output at side A after a lapse of 2W from an initial period. While an output operation is performed at side A, an input operation is performed through side B. This means that the shift register 421 is operating by changing its shift direction. After a lapse of another 2W, when an input operation is performed again at side A and then a $q^{th}$ data bit is input, a $p^{th}$ data bit is output at side B.

An operation in a "delta block input for beta2" part is performed in the same manner as the operation in the "delta block input for beta1" part. However, since an initialization time of the shift register 422 is different from an initialization time of the shift register 421, input/output of the data bits is not performed in the same period.

In "delta block input for alpha," only input operation is performed at side A, and only output operation is performed at side B. A first received $a^{th}$ data bit is output at a time when 4W has elapsed from an initial period.

Comparing the output data bits of the shift registers 410, 421 and 422 with the output data bits shown in FIG. 6, it can be understood that the data bits are output in the same flow. However, there is a difference in that an output method of FIG. 16 generates an initial delay of 2W compared with an output method of FIG. 6. Such a difference, however, occurs while the high-rate memory buffer 260 is initially operated. That is, since the difference occurs only at an initial stage when decoding of the turbo decoder is started, it does not affect decoding performance.

Third Embodiment

FIG. 17 is a block diagram illustrating another example of the high-rate memory buffer 260 shown in FIG. 8 according to a third embodiment of the present invention. Referring to FIG. 17, the high-rate memory buffer 260 is comprised of first stage's bidirectional shift registers 521 and 522, a second stage's bidirectional shift register 510, a control logic 530, demultiplexers 541 and 542, and multiplexers 551 to 553.

The first stage's bidirectional shift registers 521 and 522 each have NW storage areas (length), and include a first terminal and a second terminal for data input/output. Here, N indicates the number of windows, and W indicates a size of the windows. The number of the shift registers is determined by the number of windows, and the number of storage areas is determined by multiplying the number of the windows by the size of the windows. The first terminal represents a terminal, i.e., a terminal of side A, arranged in the left of each of the shift registers 521 and 522, while the second terminal represents a terminal, i.e., a terminal of side B, arranged in the right of each of the shift registers 521 and 522. The first terminal and the second terminal can support data output as well as data input. Input data bits from the memory buffer 46-10 are divided into groups each comprised of bits of the length NW. The shift registers 521 and 522 each sequentially receive and shift bits of odd-numbered groups among the divided groups through the first terminal from the left (side A) to the right (side B), and if bit streams of the length are formed, the shift registers 521 and 522 each sequentially output the formed bit streams through the first terminal from the right to the left, the reverse order of the input order. The shift registers 521 and 522 each sequentially receive and shift bits of even-numbered groups among the divided groups through the second terminal from the right (side B) to the left (side A), and if bit streams of the length are formed, the shift registers 521 and 522 each sequentially output the formed bit streams through the second terminal from the left to the right, the reverse order of the input order.

The second stage's bidirectional shift register 510 has NW storage areas, and includes a third terminal and a fourth terminal for data input/output. The shift register 510 receives bits sequentially output via the first terminal of the shift register 521, via its third terminal, and sequentially shifts the received bits from the left to the right. If bit streams of the length are formed, the shift register 510 shifts the formed bit streams from the right to the left, the reverse order of the input order, and sequentially outputs the shifted bit streams via the third terminal. The shift register 510 receives bits sequentially output via the second terminal of the shift register 521, via its fourth terminal, and sequentially shifts the received bits from the right to the left. If bit streams of the length are formed, the shift register 510 shifts the formed bit streams from the left to the right, the reverse order of the input order, and sequentially outputs the shifted bit streams via the fourth terminal.

The demultiplexers 541 and 542 are provided between an output terminal of the memory buffer 46-10 and the shift registers 521 and 522, and the multiplexers 551 to 553 are provided between the shift registers 510, 521 and 522 and the delta metric calculation section 210. Input terminals of the demultiplexers 541 and 542 are connected to the output terminal of the memory buffer 46-10, first output terminals of the demultiplexers 541 and 542 are connected to second terminals of the shift registers 521 and 522, and second output terminals of the demultiplexers 541 and 542 are connected to first terminals of the shift registers 521 and 522. First input terminals of the multiplexers 551 to 553 are connected to second terminals of the shift registers 510, 521 and 522, second input terminals of the multiplexers 551 to 553 are connected to first terminals of the shift registers 510, 521 and 522, and output terminals of the multiplexers 551 to 553 are connected to the delta metric calculators 211 to 213.

The control logic 530 provides select signals select1, selec2 and selec3 for controlling operations of the shift registers 510, 521 and 522, the demultiplexers 541 and 542, and the multiplexers 551 to 553. The select signals can be designated as signals for controlling input data bits from the memory buffer 46-10 so that the input data bits are applied to the shift registers 521 and 522 at different times. The control logic 530 determines whether the input data bits from the memory buffer 46-10 are bits of odd-numbered groups or bits of even-numbered groups among the divided groups, and provides the shift registers 521 and 522 with select signals select2 and select3 for applying the input data bits to the first terminals or the second terminals according to the determination result.

For example, the control logic 530 outputs select signals of "0" or "logic low" level when the input data bits are bits of the odd-numbered groups, and the control logic 330 outputs select signals of "1" or "logic high" level when the input data bits are bits of the even-numbered groups. When select signals of "0" level are output, the demultiplexers 541 and 542 apply the input data bits from the memory buffer 46-10 to the first terminals of the shift registers 521 and 522. Then the shift registers 521 and 522 sequentially shift the data bits received through their first terminals from the left to the right (in the right direction). At the same time, the shift registers 521 and 522 sequentially shift again 2W data bits previously received through their second terminals and then stored, from the left to the right, and output the shifted data bits through their second terminals.

When select signals of "1" level are output, the demultiplexers 541 and 542 apply the input data bits from the memory buffer 46-10 to the second terminals of the shift registers 521 and 522. Then the shift registers 521 and 522 sequentially shift the data bits received through their second terminals from the right to the left (in the left direction). At the same time, the shift registers 521 and 522 sequentially shift again 2W data bits previously received through their first terminals and then stored, from the right to the left, and output the shifted data bits through their first terminals.

Data bits output through the first terminals of the shift registers 521 and 522 are applied to the second input terminals of the multiplexers 552 and 553, and data bits output through the second terminals of the shift registers 521 and 522 are applied to the first input terminals of the multiplexers 552 and 553. The multiplexers 552 and 553 multiplex data bits applied through their first input terminals and second input terminals, and output the multiplexed data bits to corresponding delta metric calculators 211 to 213.

Data bits output via the first terminal of the shift register 521 are also applied to the first terminal of the shift register 510, and data bits output via the second terminal of the shift register 521 are also applied to the second terminal of the shift register 510. An operation of the shift register 510 is equal to the operations of the shift registers 521 and 522. Data bits output via the first terminal of the shift register 510 are applied to the second input terminal of the multiplexer 551, and data bits output via the second terminal of the shift register 510 are applied to the first input terminal of the multiplexer 551. Data bits output from the multiplexer 551 are applied to the delta metric calculator 211 connected to a front end of the alpha metric calculator 220.

This embodiment of the present invention is different in structure from the high-rate memory buffer 260 shown in FIG. 12, but identical in terms of operation. According to this embodiment of the present invention, the shift register 510 for an α metric is a bidirectional shift register having a length of 2W unlike the embodiments shown in FIGS. 9 and 12, and the shift register 510 receives the data bits provided from the shift register 521 for a β1 metric, instead of receiving the data bits provided from the memory buffer 46-10, and then outputs the data bits via the multiplexer 551. That is, the shift register 510 with the same structure receives again the output of the shift register 521 for a β1 metric. In this embodiment, if the shift register 521 for a β1 metric is arranged in the reverse order of an actually received signal, it is reconstructed in the reverse order to restore a signal in order of an original input signal and then apply the restored signal to the shift register 510 for an α metric. If the high-rate memory buffer is constructed so that the shift register 510 for an α metric and the sift register 521 for a β1 metric always operate in the opposite direction, the memory buffer can reduce a size of the shift registers by 2W, compared to the high-rate memory buffer shown in FIG. 12.

Figure 18:
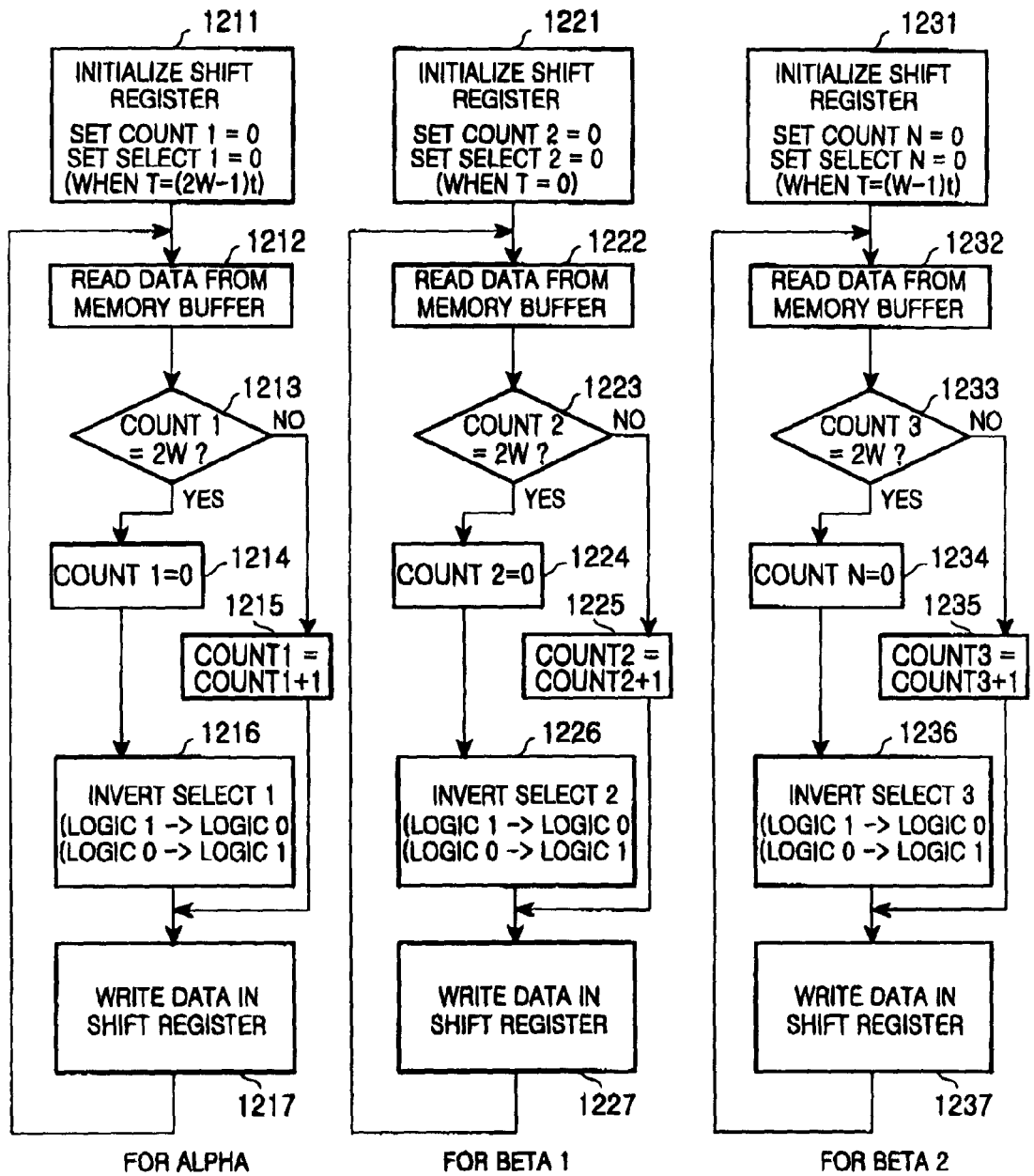
FIG. 18 is a flow chart illustrating an example of a control operation performed by the control logic of FIG. 17 according to an embodiment of the present invention.

FIG. 18 is a flow chart illustrating an example of a control operation performed by the control logic 530 of FIG. 17 according to an embodiment of the present invention. A process flow for the control operation shown in the drawing is similar to the process flow illustrated in FIG. 13. However, the only difference is that a flow for controlling the shift register 510 for an α metric is added. In the control flow, steps 1211, 1221 and 1231 indicating initialization processes are different.

Referring to FIG. 18, the shift register 510 for an α metric is initialized at a time T=(2W−1)t, and the shift register 521 for a β1 metric is initialized at a time T=0, and the shift register 522 for a β2 metric is initialized at a time T=(W−1)t. That is, the shift register 510 is initialized after a clock (2W−1), the shift register 521 is initialized at a clock 0, and the shift register 522 is initialized after a clock (W−1). Considering that the entire period of the shift registers is 4W, it is noted that the two shift registers operate in the opposite direction at periods of 2W. Except for the initialization processes, FIG. 18 is identical in operation to FIG. 13, so a detailed description thereof will be omitted for simplicity.

Figure 19:
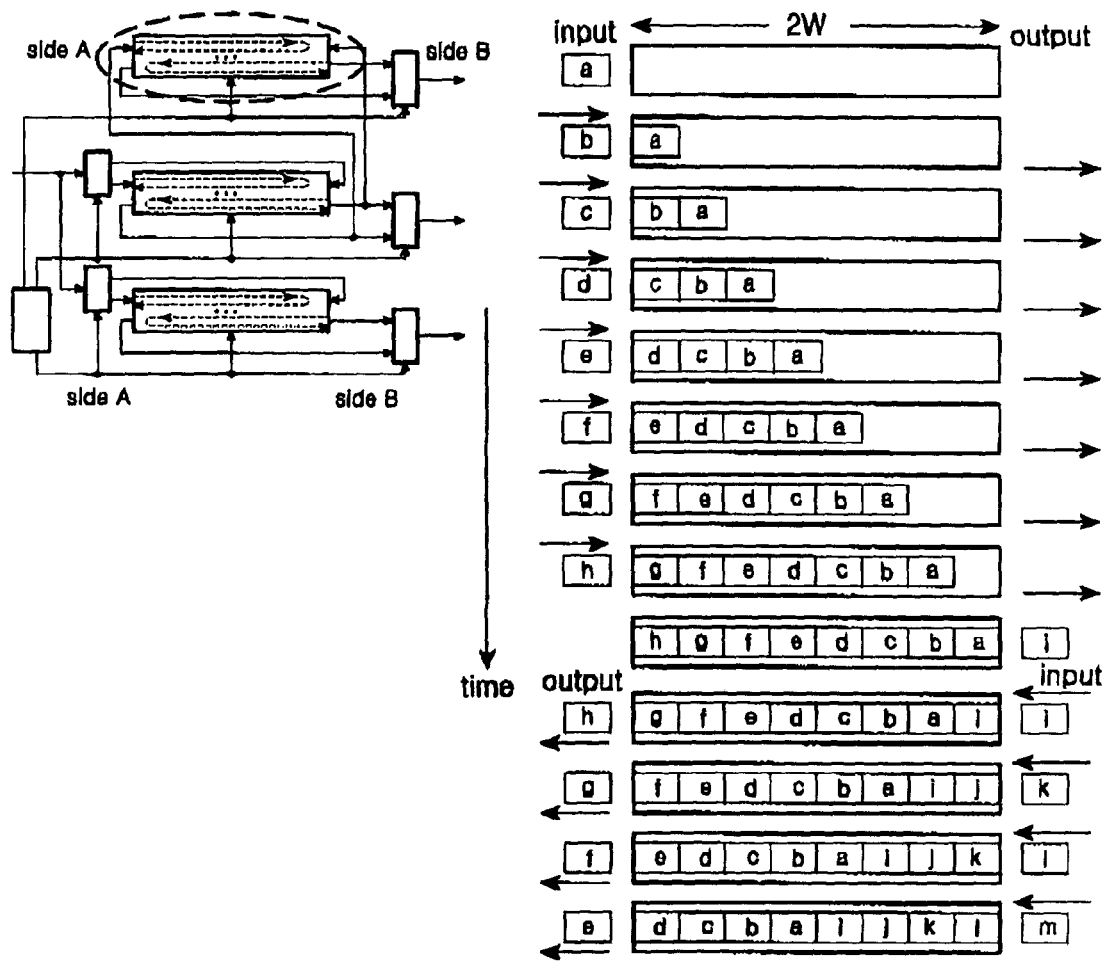
FIG. 19 is a block diagram illustrating an example of a data processing flow performed by the shift register for an alpha metric, shown in FIG. 17 according to an embodiment of the present invention.

FIG. 19 is a block diagram illustrating an example of a data processing flow performed by the shift register 510 of FIG. 17 according to an embodiment of the present invention. Referring to FIG. 19, the data processing operation by the shift register 510 is performed in the same way as the data processing operation by the shift registers for a β metric, described in conjunction with FIG. 15.

Figure 20:
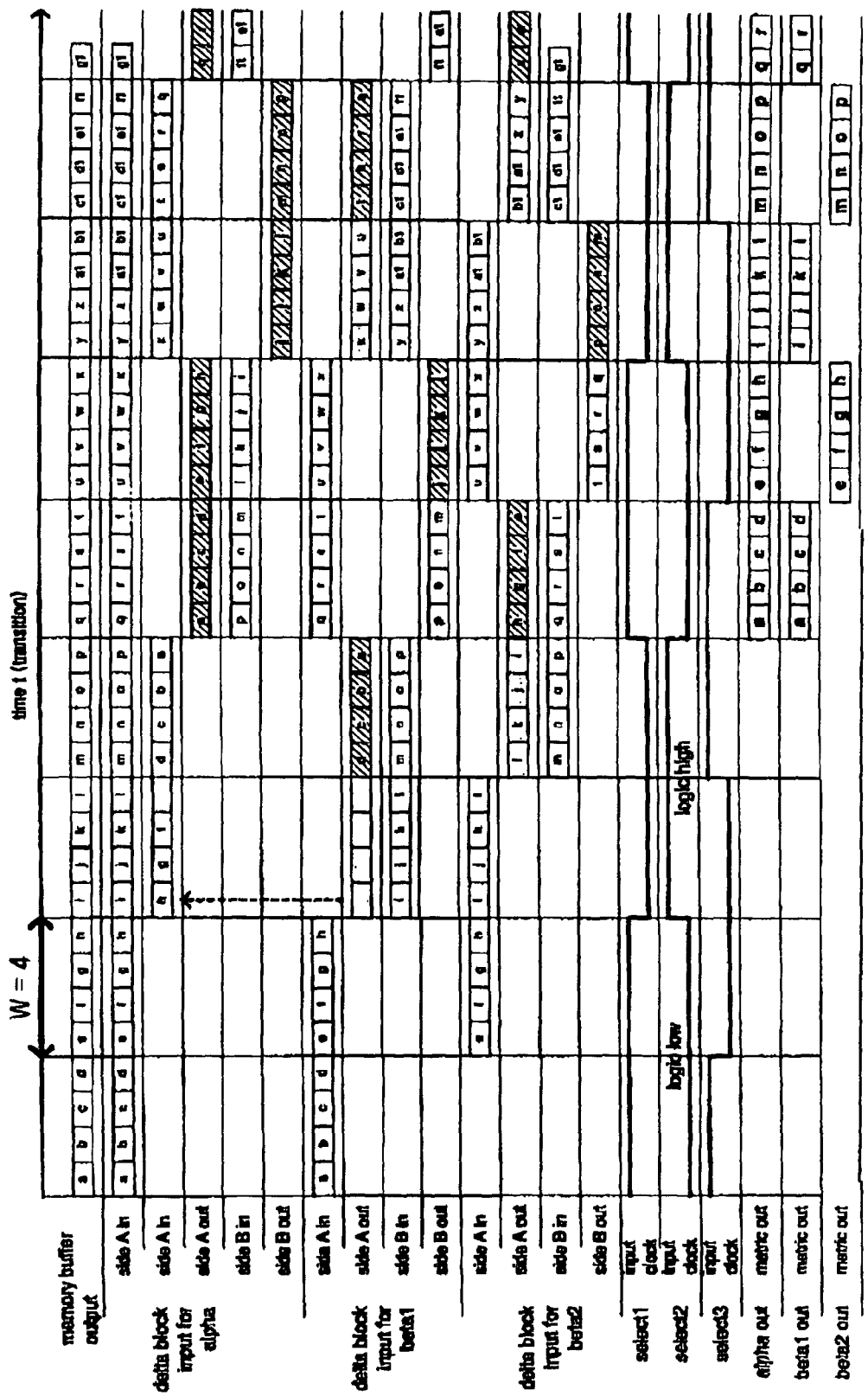
FIG. 20 is a block diagram illustrating an example of a memory buffer access operation timing performed by the high-rate memory buffer of FIG. 17 according to an embodiment of the present invention.

FIG. 20 is a block diagram illustrating an example of a memory buffer access operation timing performed by the high-rate memory buffer 260 of FIG. 17 according to an embodiment of the present invention. Referring to FIG. 20, a memory buffer access operation by the high-rate memory buffer 260 is different in operation of the shift register 510, but provides the same α, β1 and β2 metrics in conclusion.

As described above, the invention provides data bits from a memory buffer of a receiver to a turbo decoder by using a high-rate memory buffer having the same operating frequency as the turbo decoder. In addition, the invention enables realization of an apparatus suitable for a mobile communication environment requiring lower power consumption, by removing a necessity to increase an operating frequency of a memory buffer of a receiver.

While the invention has been shown and described with reference to a certain embodiments thereof, it will be understood by those skilled in the art that various changes in form and details may be made therein without departing from the spirit and scope of the invention as defined by the appended claims and equivalents thereof.

What is claimed is:

1. A memory buffer for receiving a frame comprised of sequential input symbols and providing the input symbols to an N-window mode Soft-In Soft-Out (SISO) decoder having a window size of W symbols, comprising:
    a first shift register having an input terminal, an output terminal and a clock input terminal, for sequentially shifting and storing 2NW serial symbols from the input terminal in a predetermined direction, and sequentially outputting the shifted symbols via the output terminal; and
    N second shift registers, wherein each of the second shift registers includes a clock input terminal, first and second input terminals, first and second output terminals, and select terminals, the second shift registers are sequentially activated or initialized at intervals of W symbols from serial symbols received at the input terminal of the first shift register, each of the second shift registers receives first NW symbols among the serial symbols after its activation, and shifts and stores the received symbols in the predetermined direction, thereafter, each of the second shift registers receives second NW symbols via its second input terminal, shifts and stores the received symbols in the opposite direction of the predetermined direction, and at the same time, serially outputs the stored first NW symbols via its first output terminal, thereafter, each of the second shift registers receives third NW symbols via the first input terminal, shifts and stores the received symbols in the predetermined direction, and at the same time, serially outputs the stored second NW symbols via its second output terminal,
    wherein N refers to an integer and a number of windows, W refers to an integer and a size of windows, NW refers to N times W and a length of data bit streams, and 2NW refers to two (2) times NW.

2. The memory buffer of claim 1, wherein the W symbols include first to $W^{th}$ consecutive symbols of the received frame.

3. The memory buffer of claim 1, wherein each of the shift registers operates in response to transitions of a clock.

4. The memory buffer of claim 1, wherein N comprises 2.

5. The memory buffer of claim 1, wherein the W window symbols are determined by dividing the received frame into a predetermined number of frames.

6. A turbo decoding apparatus in a communication system, comprising:
    a unidirectional shift register having an input terminal for data input and an output terminal for data output, the unidirectional shift register forming bit streams of a first length by sequentially receiving and shifting input data bits via the input terminal and then sequentially outputting the formed bit streams of the first length via the output terminal;
    a memory buffer including one or more bidirectional shift registers having a first terminal and a second terminal for data input/output, the input data bits being divided into groups each comprised of bits of a second length which is ½ of the first length, the bidirectional shift register forming bit streams of the second length by sequentially receiving and shifting bits of odd-numbered groups among the divided groups via the first terminal and then sequentially outputting the formed bit streams via the first terminal; and forming bit streams of the second length by sequentially receiving and shifting bits of even-numbered groups among the divided groups via the second terminal and then sequentially outputting the formed bit streams via the second terminal;
    a first metric calculation section for receiving output bits of the respective shift registers, and calculating corresponding delta metrics;
    a second metric calculation section for receiving a delta metric from the first metric calculation section corresponding to the unidirectional shift register, and calculating an alpha metric;
    a third metric calculation section for receiving delta metrics from the first metric calculation section corresponding to the bidirectional shift registers, and calculating beta metrics;
    a fourth metric calculation section for receiving the alpha metric, also receiving a multiplexing result of the beta metrics, and calculating Log Likelihood Ratio (LLR) values corresponding to the respective shift registers; and a Soft-In Soft-Out (SISO) decoder including a subtraction section for subtracting an output of the unidirectional shift register from the respective LLR values, and outputting the subtraction result for interleaving/deinterleaving.

7. The turbo decoding apparatus of claim 6, wherein the memory buffer further comprises a control logic for determining whether the input data bits are bits of odd-numbered groups or bits of even-numbered groups among the divided groups, and providing the bidirectional shift registers with select signals for applying the input data bits to the first terminal or the second terminal according to the determination result.

8. The turbo decoding apparatus of claim 7, wherein the memory buffer further comprises a demultiplexer and a multiplexer corresponding to each of the bidirectional shift registers;
wherein the demultiplexer has an input terminal for receiving the input data bits and a first output terminal and a second output terminal connected to the first terminal and the second terminal, respectively, applies bits of the odd-numbered groups to the first terminal via the first output terminal in response to a corresponding select signal provided from the control logic, and applies bits of the even-numbered groups to the second terminal via the second output terminal;
wherein the multiplexer multiplexes bit streams output via the first terminal and bit streams output via the second terminal in response to the corresponding select signal provided from the control logic, and outputs the multiplexed bit streams to the first metric calculation section.

9. The turbo decoding apparatus of claim 7, wherein the select signals are control signals for applying the input data bits to the bidirectional shift registers at different times.

10. The turbo decoding apparatus of claim 6, wherein the bits of the odd-numbered groups are sequentially output via the first terminal and, at the same time, the bits of the even-numbered groups are sequentially received and shifted via the second terminal.

11. The turbo decoding apparatus of claim 6, wherein the number of the bidirectional shift registers is determined by the number of windows.

12. The turbo decoding apparatus of claim 6, wherein the first length and the second length are determined by a size of windows and the number of windows.

13. The turbo decoding apparatus of claim 12, wherein the second length is determined by multiplying the size of windows by the number of windows.

14. The turbo decoding apparatus of claim 6, wherein the input data bits are received at a clock rate of a turbo decoder.

15. A turbo decoding apparatus in a communication system, comprising:
one or more first stage's bidirectional shift registers having a first terminal and a second terminal for data input/output, input data bits being divided into groups each comprised of bits of a predetermined length, the first stage's bidirectional shift registers forming bit streams of the length by sequentially receiving and shifting bits of odd-numbered groups among the divided groups via the first terminal and then sequentially outputting the formed bit streams via the first terminal; and forming bit streams of the length by sequentially receiving and shifting bits of even-numbered groups among the divided groups via the second terminal and then sequentially outputting the formed bit streams via the second terminal;
a memory buffer including a second stage's bidirectional shift register having a third terminal and a fourth terminal for data input/output, the second stage's bidirectional shift register forming bit streams of the length by sequentially receiving and shifting bits sequentially output via the first terminal, via the third terminal, and then sequentially outputting the formed bit streams via the third terminal; and forming bit streams of the length by sequentially receiving and shifting bits sequentially output via the second terminal, via the fourth terminal, and then sequentially outputting the formed bit streams via the fourth terminal;
a first metric calculation section for receiving output bits of the respective shift registers, and calculating corresponding delta metrics;
a second metric calculation section for receiving a delta metric from the first metric calculation section corresponding to the unidirectional shift register, and calculating an alpha metric;
a third metric calculation section for receiving delta metrics from the first metric calculation section corresponding to the bidirectional shift registers, and calculating beta metrics;
a fourth metric calculation section for receiving the alpha metric, also receiving a multiplexing result of the beta metrics, and calculating Log Likelihood Ratio (LLR) values corresponding to the respective shift registers; and
a Soft-In Soft-Out (SISO) decoder including a subtraction section for subtracting an output of a unidirectional shift register from the respective LLR values, and outputting the subtraction result for interleaving/deinterleaving.

16. The turbo decoding apparatus of claim 15, wherein the memory buffer further comprises a control logic for determining whether the input data bits are bits of odd-numbered groups or bits of even-numbered groups among the divided groups, and providing the first stage's bidirectional shift registers with select signals for applying the input data bits to the first terminal or the second terminal according to the determination result.

17. The turbo decoding apparatus of claim 16, wherein the memory buffer further comprises a demultiplexer and a multiplexer corresponding to each of the first stage's bidirectional shift registers;
wherein the demultiplexer has an input terminal for receiving the input data bits and a first output terminal and a second output terminal connected to the first terminal and the second terminal, respectively, applies bits of the odd-numbered groups to the first terminal via the first output terminal in response to a corresponding select signal provided from the control logic, and applies bits of the even-numbered groups to the second terminal via the second output terminal;
wherein the multiplexer multiplexes bits output via the first terminal and bits output via the second terminal in response to the corresponding select signal provided from the control logic, and outputs the multiplexed bits to the first metric calculation section.

18. The turbo decoding apparatus of claim 16, wherein the memory buffer further comprises a multiplexer corresponding to the second stage's bidirectional shift register, the multiplexer multiplexing bits output via the third terminal and bits output via the fourth terminal in response to a corresponding select signal provided from the control logic, and outputting the multiplexed bits to the first metric calculation section.

19. The turbo decoding apparatus of claim 16, wherein the select signals are control signals for applying the input data bits to the bidirectional shift registers at different times.

20. The turbo decoding apparatus of claim 15, wherein the bits of the odd-numbered groups are sequentially output via the first terminal and, at the same time, the bits of the even-numbered groups are sequentially received and shifted via the second terminal.

21. The turbo decoding apparatus of claim 15, wherein the number of the first stage's shift registers is determined by the number of windows.

22. The turbo decoding apparatus of claim 15, wherein the input data bits are received at a clock rate of a turbo decoder.

23. A method of providing a memory buffer for receiving a frame comprised of sequential input symbols and providing the input symbols to an N-window mode Soft-In Soft-Out (SISO) decoder having a window size of W symbols, the method comprising the steps of:
sequentially shifting and storing 2NW serial symbols from an input terminal of a first shift register in a predetermined direction;
sequentially outputting the shifted symbols via a output terminal of the first shift register; sequentially activating or initializing N second shift registers at intervals of W symbols from serial symbols received at the input terminal of the first shift register, wherein each of the second shift registers includes a clock input terminal, first and second input terminals, first and second output terminals, and select terminals;
receiving at each of the second shift registers first NW symbols among the serial symbols after its activation;
shifting and storing the received symbols in the predetermined direction, thereafter, each of the second shift registers receiving second NW symbols via its second input terminal; and
shifting and storing the received symbols in the opposite direction of the predetermined direction, and simultaneously, serially outputting the stored first NW symbols via its first output terminal, thereafter, each of the second shift registers receiving third NW symbols via the first input terminal, shifting and storing the received symbols in the predetermined direction, and simultaneously, serially outputting the stored second NW symbols via its second output terminal,
wherein N refers to an integer and a number of windows, W refers to an integer and a size of windows, NW refers to N times W and a length of data bit streams, and 2NW refers to two (2) times NW.

24. The method of claim 23, wherein N comprises 2.

25. The method of claim 23, further comprising:
dividing the received frame into a predetermined number of frames to determine the W window symbols.

26. A method of providing a turbo decoding in a communication system, the method comprising:
forming at a unidirectional shift register having an input terminal for data input and an output terminal for data output, bit streams of a first length by sequentially receiving and shifting input data bits via the input terminal and then sequentially outputting the formed bit streams of the first length via the output terminal;
dividing input data into groups the input data each comprised of bits of a second length which is ½ of the first length, at a memory buffer including one or more bidirectional shift registers having a first terminal and a second terminal for data input/output, the bidirectional shift register forming bit streams of the second length by sequentially receiving and shifting bits of odd-numbered groups among the divided groups via the first terminal and then sequentially outputting the formed bit streams via the first terminal; and forming bit streams of the second length by sequentially receiving and shifting bits of even-numbered groups among the divided groups via the second terminal and then sequentially outputting the formed bit streams via the second terminal;
receiving output bits of the respective shift registers, and calculating corresponding delta metrics at a first metric calculation section;
receiving a delta metric from the first metric calculation section corresponding to the unidirectional shift register, and calculating an alpha metric at a second metric calculation section;
receiving delta metrics from the first metric calculation section corresponding to the bidirectional shift registers, and calculating beta metrics at a third metric calculation section;
receiving the alpha metric, also receiving a multiplexing result of the beta metrics, and calculating Log Likelihood Ratio (LLR) values corresponding to the respective shift registers at a fourth metric calculation section; and
subtracting an output of the unidirectional shift register from the respective LLR values, and outputting the subtraction result for interleaving/deinterleaving at a Soft-In Soft-Out (SISO) decoder including a subtraction section.

27. The method of claim 26, further comprising:
determining whether the input data bits are bits of odd-numbered groups or bits of even-numbered groups among the divided groups via the memory buffer for a control logic; and
providing the bidirectional shift registers with select signals for applying the input data bits to the first terminal or the second terminal according to the determination result.

28. The method of claim 26, wherein the memory buffer further comprises a demultiplexer and a multiplexer corresponding to each of the bidirectional shift registers;
wherein the demultiplexer has an input terminal for receiving the input data bits and a first output terminal and a second output terminal connected to the first terminal and the second terminal, respectively, applies bits of the odd-numbered groups to the first terminal via the first output terminal in response to a corresponding select signal provided from a control logic, and applies bits of the even-numbered groups to the second terminal via the second output terminal; and
wherein the multiplexer multiplexes bit streams output via the first terminal and bit streams output via the second terminal in response to the corresponding select signal provided from the control logic, and outputs the multiplexed bit streams to the first metric calculation section.

29. The method of claim 26, wherein a select signals are control signals for applying the input data bits to the bidirectional shift registers at different times.

30. The method of claim 26, wherein the bits of the odd-numbered groups are sequentially output via the first terminal and, at the same time, the bits of the even-numbered groups are sequentially received and shifted via the second terminal.

31. The method of claim 26, wherein the number of the bidirectional shift registers is determined by the number of windows.

32. The method of claim 26, wherein the first length and the second length are determined by a size of windows and the number of windows.

33. The method of claim 32, wherein the second length is determined by multiplying the size of windows by the number of windows.

34. The method of claim 26, wherein the input data bits are received at a clock rate of a turbo decoder.

35. A method of providing turbo decoding in a communication system, comprising:

dividing input data bits into groups each comprised of bits of a predetermined length, via one or more first stage's bidirectional shift registers having a first terminal and a second terminal for data input/output, the first stage's bidirectional shift registers forming bit streams of the length by sequentially receiving and shifting bits of odd-numbered groups among the divided groups via the first terminal and then sequentially outputting the formed bit streams via the first terminal; and forming bit streams of the length by sequentially receiving and shifting bits of even-numbered groups among the divided groups via the second terminal and then sequentially outputting the formed bit streams via the second terminal;

forming at a second stage's bidirectional shift register having a third terminal and a fourth terminal for data input/output, bit streams of the length by sequentially receiving and shifting bits sequentially output via the first terminal, via the third terminal, and then sequentially outputting the formed bit streams via the third terminal; and forming bit streams of the length by sequentially receiving and shifting bits sequentially output via the second terminal, via the fourth terminal, and then sequentially outputting the formed bit streams via the fourth terminal;

receiving output bits of the respective shift registers, and calculating corresponding delta metrics at a first metric calculation section;

receiving a delta metric from the first metric calculation section corresponding to a unidirectional shift register, and calculating an alpha metric at a second metric calculation section;

receiving delta metrics from the first metric calculation section corresponding to the bidirectional shift registers, and calculating beta metrics at a third metric calculation section;

receiving the alpha metric, also receiving a multiplexing result of the beta metrics, and calculating Log Likelihood Ratio (LLR) values corresponding to the respective shift registers at a fourth metric calculation section; and subtracting an output of a unidirectional shift register from the respective LLR values, and outputting the subtraction result for interleaving/deinterleaving at a Soft-In Soft-Out (SISO) decoder including a subtraction section.

36. The method of claim 35, further comprising:

determining whether the input data bits are bits of odd-numbered groups or bits of even-numbered groups among the divided groups for a control logic; and providing the first stage's bidirectional shift registers with select signals for applying the input data bits to the first terminal or the second terminal according to the determination result.

37. The method of claim 36, wherein a memory buffer further comprises a demultiplexer and a multiplexer corresponding to each of the first stage's bidirectional shift registers;

wherein the demultiplexer has an input terminal for receiving the input data bits and a first output terminal and a second output terminal connected to the first terminal and the second terminal, respectively, applies bits of the odd-numbered groups to the first terminal via the first output terminal in response to a corresponding select signal provided from the control logic, and applies bits of the even-numbered groups to the second terminal via the second output terminal;

wherein the multiplexer multiplexes bits output via the first terminal and bits output via the second terminal in response to the corresponding select signal provided from the control logic, and outputs the multiplexed bits to the first metric calculation section.

38. The method of claim 36, further comprising:

multiplexing bits output via the third terminal and bits output via the fourth terminal in response to a corresponding select signal provided from the control logic via a multiplexer of a memory buffer corresponding to the second stage's bidirectional shift register; and outputting the multiplexed bits to the first metric calculation section.

39. The method of claim 36, wherein the select signals comprises control signals for applying the input data bits to the bidirectional shift registers at different times.

40. The method of claim 35, wherein the bits of the odd-numbered groups are sequentially output via the first terminal and, at the same time, the bits of the even-numbered groups are sequentially received and shifted via the second terminal.

41. The method of claim 35, further comprising:

determining the number of the first stage's shift registers by the number of windows.

42. The method of claim 35, further comprising:

receiving the input data bits at a clock rate of a turbo decoder.

* * * * *

UNITED STATES PATENT AND TRADEMARK OFFICE
CERTIFICATE OF CORRECTION

PATENT NO. : 7,584,389 B2
APPLICATION NO. : 10/634746
DATED : September 1, 2009
INVENTOR(S) : Park et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1560 days.

Signed and Sealed this

Fourteenth Day of September, 2010

David J. Kappos
*Director of the United States Patent and Trademark Office*